(12) United States Patent
Underhill et al.

(10) Patent No.: US 6,417,707 B1
(45) Date of Patent: Jul. 9, 2002

(54) NOISE REDUCTION CIRCUITS

(75) Inventors: Michael James Underhill, Lingfield; Neil Alexander Downie, Guildford, both of (GB)

(73) Assignee: Toric Limited, London (GB)

( * ) Notice: Subject to any disclaimer, the term of this patent is extended or adjusted under 35 U.S.C. 154(b) by 0 days.

(21) Appl. No.: 09/446,648

(22) PCT Filed: Jul. 6, 1998

(86) PCT No.: PCT/GB98/02001
§ 371 (c)(1),
(2), (4) Date: Feb. 3, 2000

(87) PCT Pub. No.: WO99/03201
PCT Pub. Date: Jan. 21, 1999

(30) Foreign Application Priority Data

| Jul. 7, 1997 | (GB) | ............................................ 9714309 |
| Jul. 30, 1997 | (GB) | ............................................ 9716041 |
| Sep. 10, 1997 | (GB) | ............................................ 9719291 |
| Mar. 11, 1998 | (GB) | ............................................ 9805017 |

(51) Int. Cl.⁷ ................................................ H03K 5/00
(52) U.S. Cl. ........................ 327/165; 327/551; 327/336
(58) Field of Search .......................... 327/34, 551, 311, 327/165, 552, 122, 336

(56) References Cited

U.S. PATENT DOCUMENTS 4,230,958 A   10/1980   Boll et al. .................. 307/353
5,548,570 A * 8/1996   Hirajima et al. .............. 369/59
5,742,200 A * 4/1998   He .............................. 327/68
6,275,101 B1 * 8/2001   Underhill .................... 327/551

FOREIGN PATENT DOCUMENTS

| EP | 0 462 752 | 12/1991 |
| GB | 1 462 408 | 1/1977 |
| GB | 2 064 273 | 6/1981 |
| GB | 2 274 032 | 7/1994 |
| GB | 2 310 331 | 8/1997 |

OTHER PUBLICATIONS

T.V. Rama Murthy, "Continuous phase shifter for square waves," *Electronic Engineering*, p. 19 (1979).

M. Underhill, "Frequency Synthesizers and Standards," *Radio Receivers*, Ch. 4 (W. Gosling, Ed., Peter Peregrinus 1996).

* cited by examiner

*Primary Examiner*—Dinh T. Le
(74) *Attorney, Agent, or Firm*—Leydig, Voit & Mayer, Ltd.

(57) ABSTRACT

A noise reduction circuit useful as a clock restoration circuit includes a DC removal circuit for removing a DC level from an input pulse train, an integrator for integrating the input pulse train after a DC level has been removed, a comparator for comparing the integrator output with a threshold value ($V_{mp}$) to detect for a missing pulse, a pulse generator inserting into the input pulse train an additional pulse delayed with respect to any missing pulse, and an output circuit for generating an output pulse train from the integrator output.

39 Claims, 26 Drawing Sheets

Fig. 4.
(a)
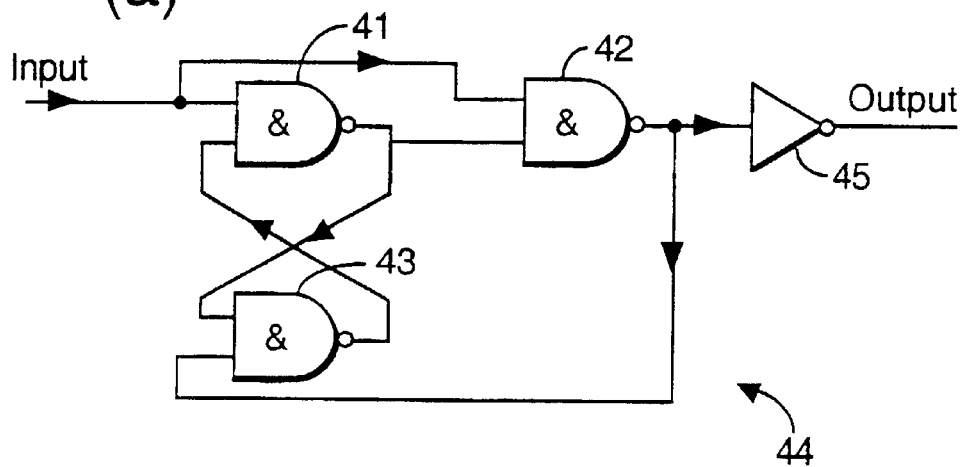
(b)
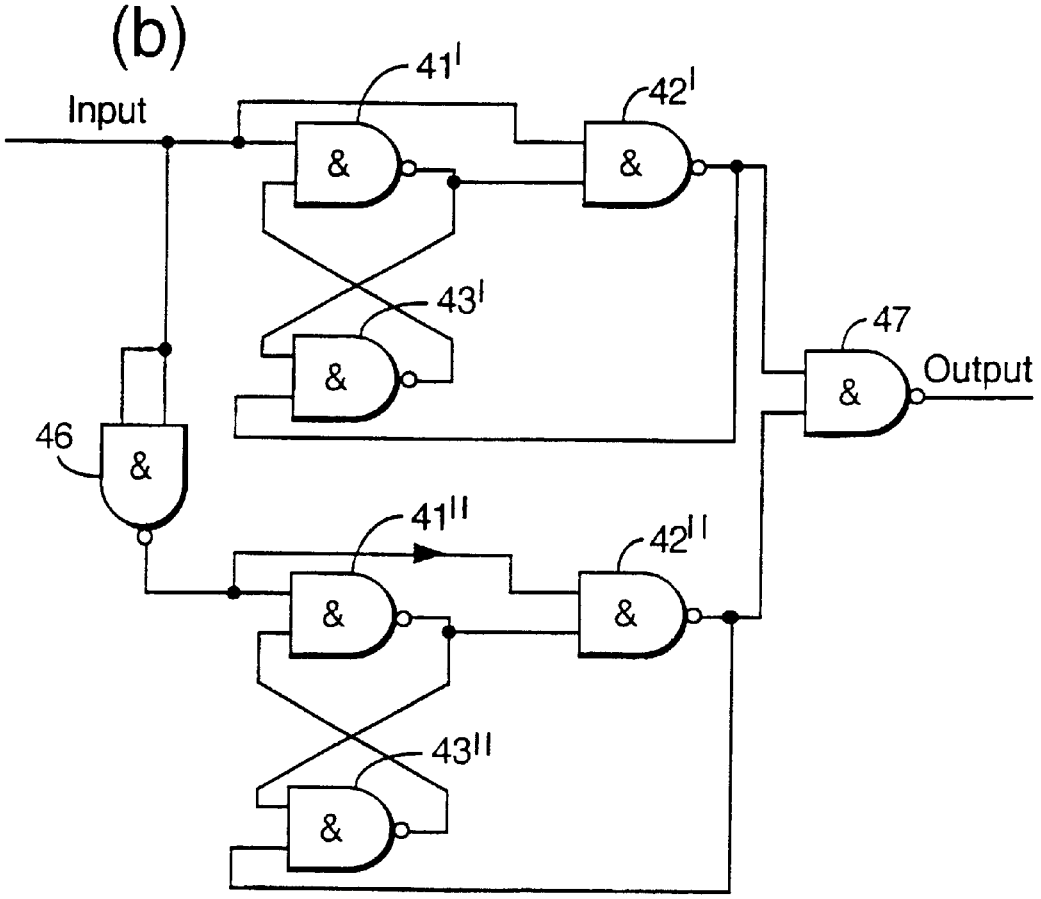

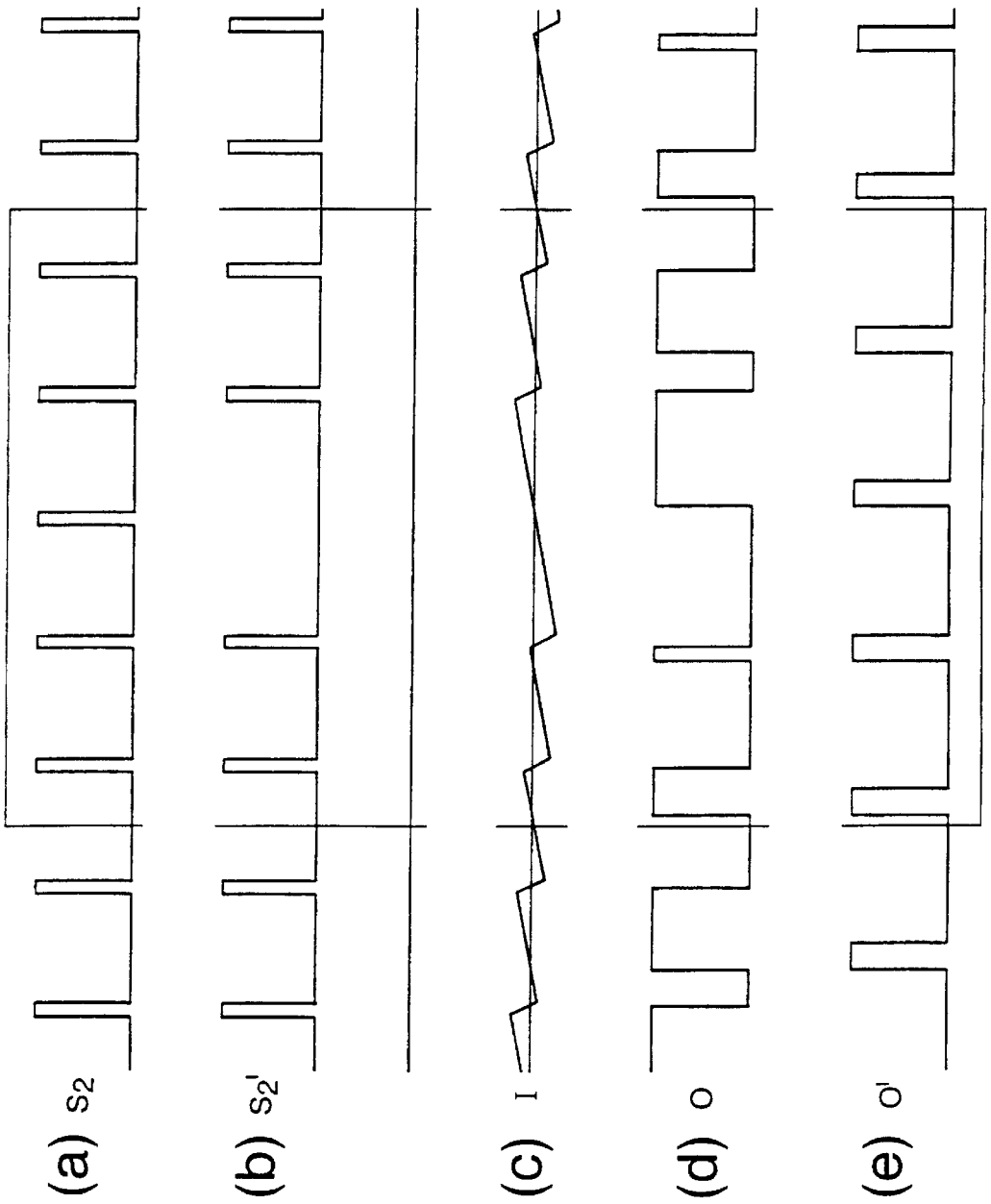

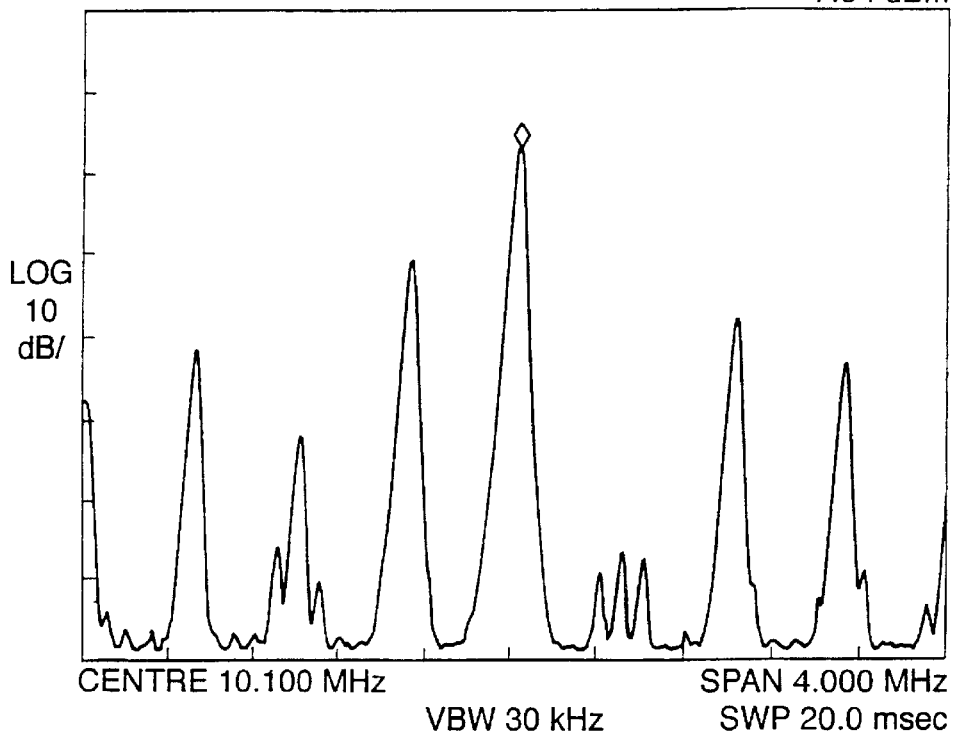
Fig.25(a). Output spectrum of DDS (a) without AJC
MKR 10.120.MHz
7.94 dBm
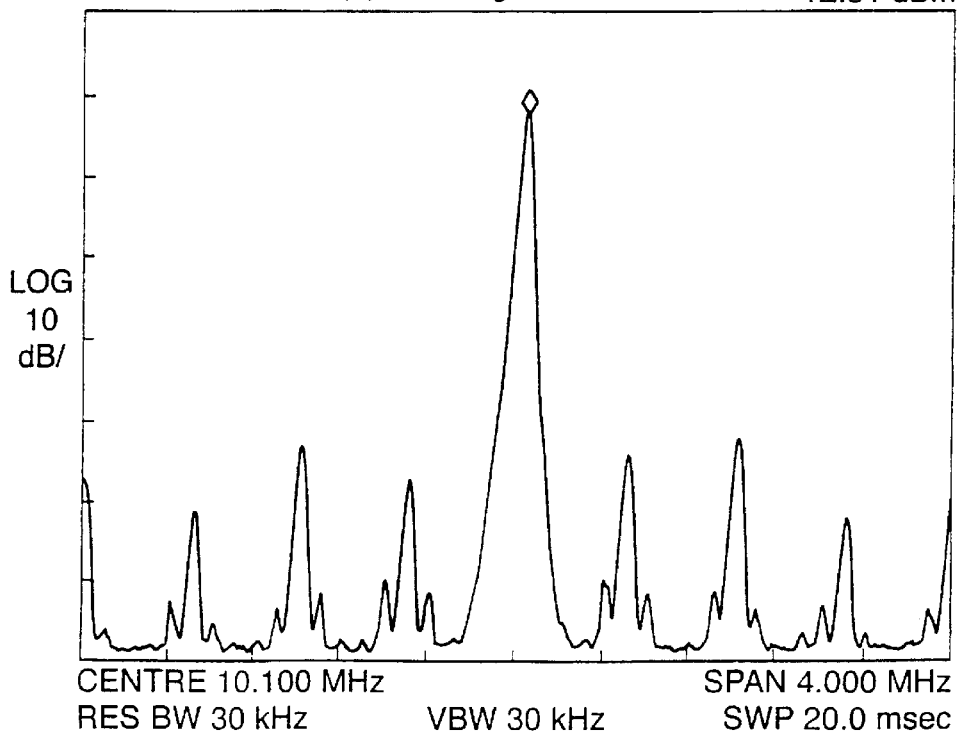
Fig.25(b). Output spectrum of DDS (b) with single AJC
MKR 10.120.MHz
12.51 dBm

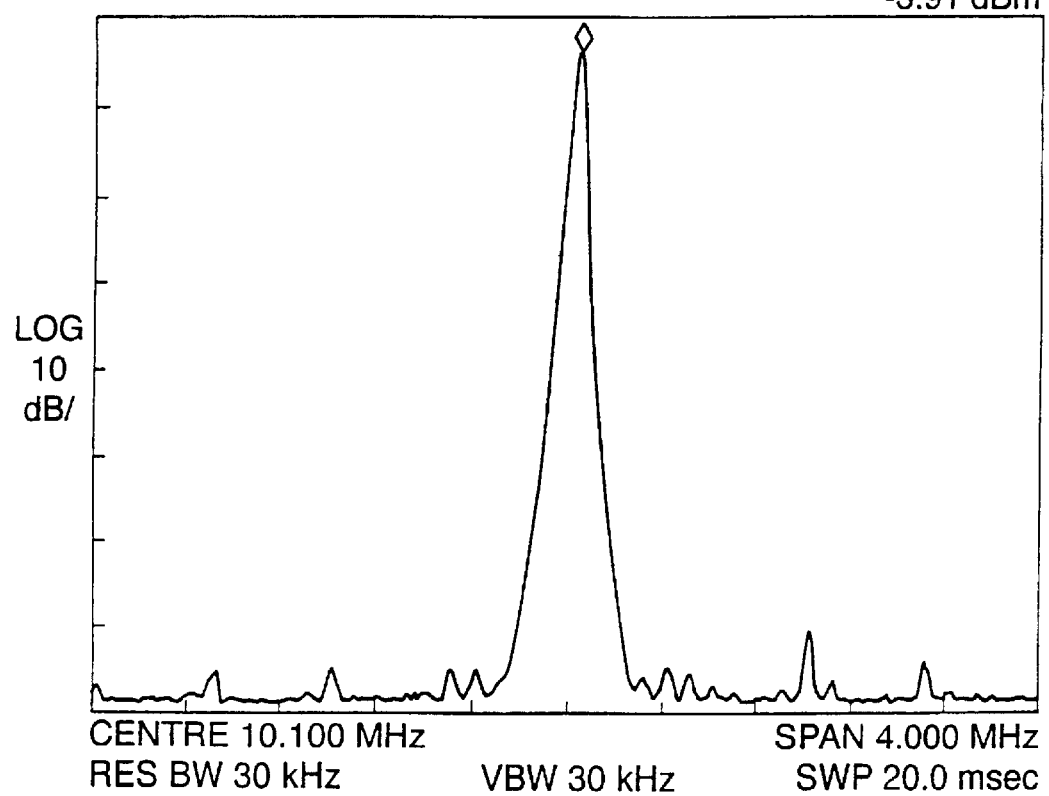
Fig.25(c). Output spectrum of DDS (c) with 2 AJC units in cascade

Fig.26(a).
(i) Wideband spectrum of fractional-n frequency synthesiser
Shows suppression of 6.991kHz components
(i) without AJC
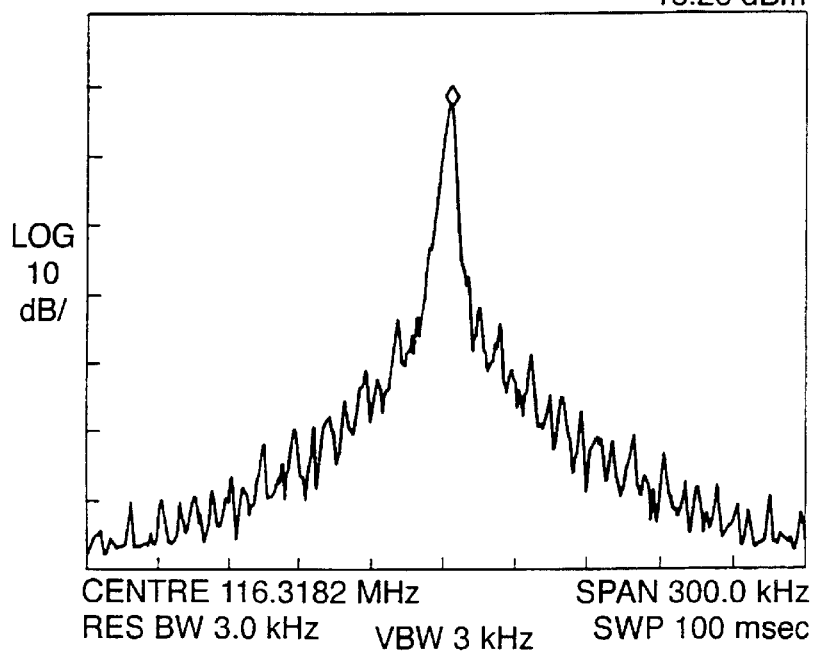
(ii) Wideband spectrum of fractional-n frequency synthesiser
Shows suppression of 6.991kHz components
(ii) with AJC
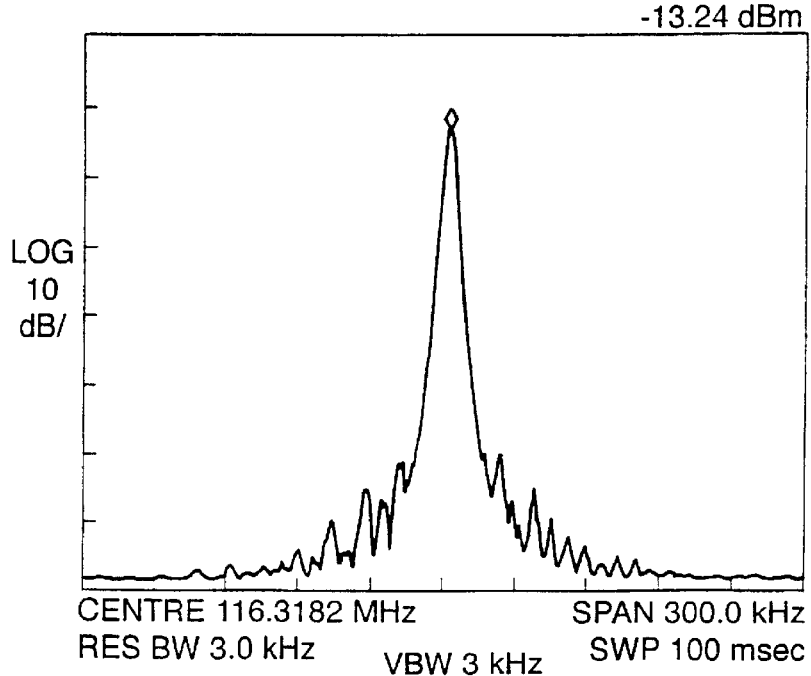

Fig.26(b).
(i) Close in phase noise of fractional-n frequency synthesiser
Shows suppression of 139.82Hz components
(i) without AJC
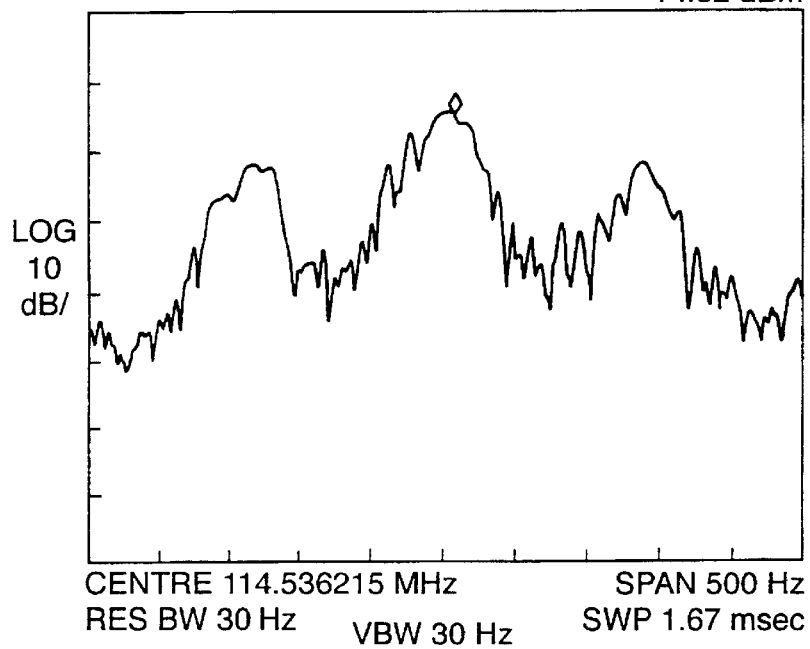
(ii) Close in phase noise of fractional-n frequency synthesiser
Shows suppression of 139.82Hz components
(ii) with AJC
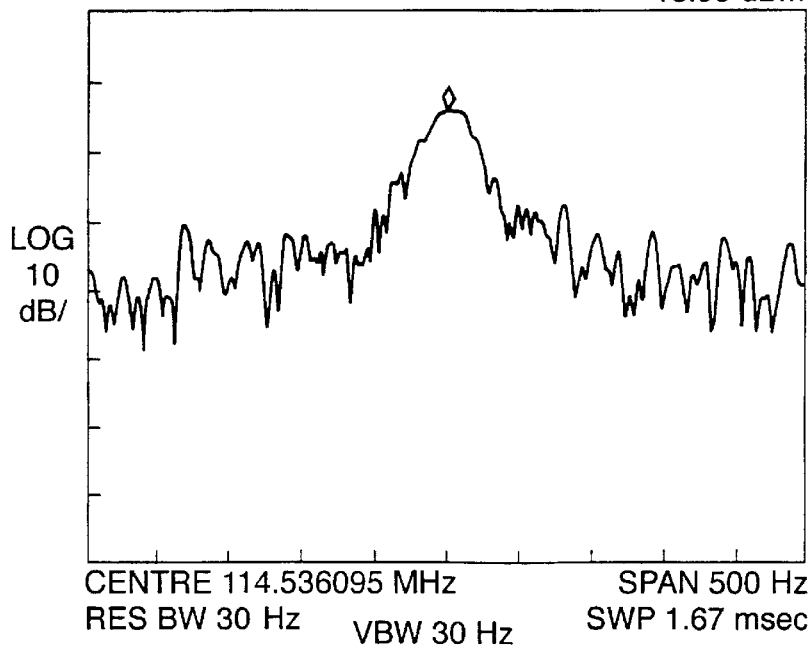

NOISE REDUCTION CIRCUITS

FIELD OF THE INVENTION

This invention relates to noise reduction circuits, for example noise reduction circuits which are useful in clock restoration circuits.

The invention also finds application, inter alia, in fractional rate multiplier circuits and in fractional-N frequency synthesisers.

BACKGROUND OF THE INVENTION

Computing and telecommunications systems operate with internal or external clock signals which effect modulation, demodulation, analogue-to-digital conversion and synchronisation of data streams. A high level of purity and/or integrity is often required by system clocks. By purity is meant low phase noise, directly proportional to time jitter. Phase noise or time jitter arises when the position of a pulse in a pulse train is displaced in time from the position expected on the assumption of strict periodicity of the pulse train. By integrity is meant a pulse stream in which none of the operative transitions is missing and in which there are no spurious, additional transitions.

A known phase-noise reduction or anti-jitter circuit is described in PCT/GB97/00405 (Publication No. WO97/30516). This circuit produces an output whose frequency is the same as the input, but whose output pulses have reduced jitter compared to the input pulses.

SUMMARY OF THE INVENTION

Noise reduction circuits according to the present invention can be used to reduce noise caused by low-level purity and/or integrity. Circuits according to the invention find a range of different applications; for example, as clock restoration circuits, in multiphase output clock distribution circuits, in low noise fractional rate multiplier circuits and in fractional-N phase locked loop synthesisers.

According to a first aspect of the invention there is provided a noise reduction circuit for reducing noise in an input pulse train consisting of pulses which in the absence of noise are periodic and from which one or more pulses is missing, the noise reduction circuit including DC removal means for removing a DC level from the input pulse train, integrator means for integrating the input pulse train after a DC level has been removed therefrom by the DC removal means, detection means for receiving an output from the integrator means and detecting therefrom a missing pulse in the input pulse train, pulse generating means responsive to the detection means for inserting into the input pulse train an additional pulse delayed with respect to a missing pulse detected by the detection means and output means for deriving an output pulse train from said output from the integrator means.

According to a second aspect of the invention there is provided a voltage controlled oscillator comprising a voltage source for generating a presettable voltage, integrator means having an input for receiving the presettable voltage, means for supplying pulses to said input in response to an output from the integrator means and means for deriving from said output a periodic pulse train at a frequency determined by the presentable voltage.

According to a third aspect of the invention there is provided a frequency multiplier comprising integrator means having an input for receiving an input pulse train having a nominal frequency f, a voltage source for supplying a presettable voltage to said input, means for inserting additional pulses into said input pulse train in response to an output from the integrator means and means for deriving from said output a periodic pulse train at a frequency nf, where n is a multiple greater than unity determined by said presettable voltage.

According to a fourth aspect of the invention there is provided a phase noise reduction circuit for reducing phase noise in an input pulse train consisting of pulses which in the absence of phase noise have a nominal frequency f, the phase noise reduction circuit comprising means for deriving a first pulse train from the input pulse train, the first pulse train consisting of pulses triggered by the positive-going transitions of the pulses forming the input pulse train, means for deriving a second pulse train from the input pulse train, the second pulse train consisting of pulses triggered by the negative-going transitions of the pulses forming the input pulse train, combining means for combining said first and second pulse trains to form a combined pulse train, DC removal means for removing a DC level for the combined pulse train, integrating means for integrating the combined pulse train after a DC level has been removed therefrom by the DC removal means to produce an integrated output and processing means for deriving from the integrated output an output pulse train at said nominal frequency f.

According to a fifth aspect of the invention there is provided a circuit for reducing noise in an input pulse train consisting of pulses which are periodic in the absence of noise and amongst which one or more spurious additional pulse is present, the circuit including DC removal means for removing a DC level from the input pulse train, integrator means for integrating the input pulse train after a DC level has been removed therefrom by the DC removal means, pulse deletion means for deleting a said spurious additional pulse from the input pulse train and output means for deriving an output pulse train from an output of the integrator means.

According to a sixth aspect of the invention there is provided a circuit for reducing phase noise in an input pulse train consisting of pulses which are periodic in the absence of noise, the circuit including DC removal means for removing a DC level from the input pulse train, integrator means for integrating the input pulse train after a DC level has been removed therefrom by the DC removal means and at least two detection means for producing different output pulse trains in response to an output of the integrator means and to respectively different reference signals, whereby each said output pulse train contains periodic transitions having a phase relationship to the input pulse train dependent on the corresponding reference signal.

According to a seventh aspect of the invention there is provided a fractional rate multiplier circuit comprising pulse train modification means for subtracting a pulse from or adding a pulse to an input pulse train in response to a control pulse to produce a modified pulse train, divider means for dividing the modified pulse train by a presettable integer, a fractional rate multiplier for deriving control pulses from the divider output and supplying the control pulses to the pulse train modification means and jitter reducing means for reducing jitter in the modified pulse train prior to division thereof by the divider means.

According to an eighth aspect of the invention there is provided a fractional-N frequency synthesiser comprising a phase-locked loop containing a fractional rate multiplier circuit according to the seventh aspect of the invention.

Embodiments of the invention are now described, by way of example only, with reference to the accompanying drawings in which:

BRIEF DESCRIPTION OF THE DRAWINGS

FIGS. 4a and 4b show short pulse monostable circuits used in the phase noise reduction circuit of FIG. 3;

FIGS. 22(a) to 22(b) show voltage waveforms observed at different points in the circuit of FIG. 21;

FIGS. 25(a), 25(b) and 25(c) show frequency spectra on the output of a 1-bit DDS running at 10.1 MHz respectively produced for the case of no AJC, a single AJC and two AJCs connected in cascade, and FIGS. 26(a) and 26(b) show the effect of suppression by an AJC of respectively the 6.991 kHz component and the 139.82 Hz component in the output of a fractional-N frequency synthesiser according to the invention.

DETAILED DESCRIPTION

Figure 1:
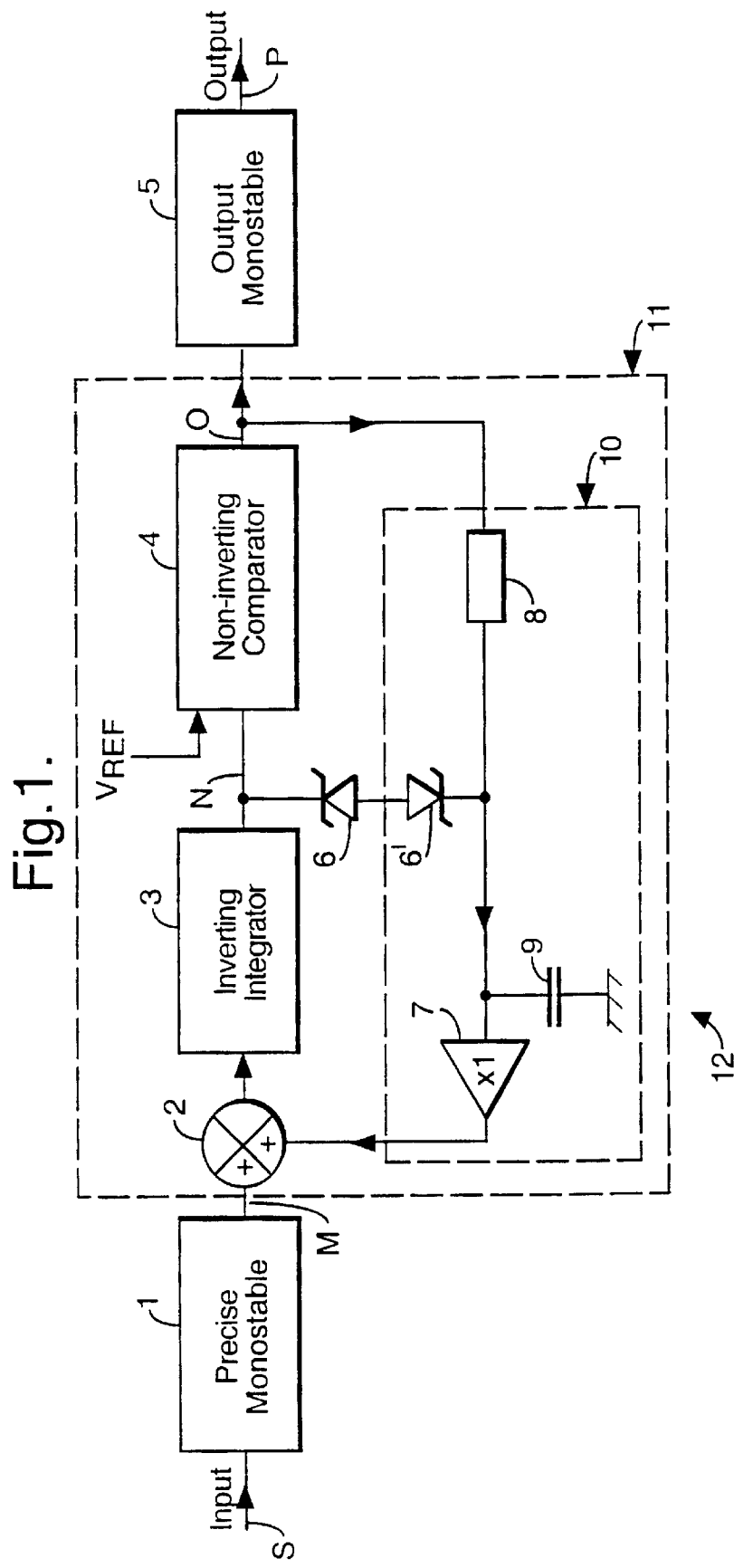
FIG. 1 shows a known phase noise reduction circuit.

FIG. 1 shows a phase noise reduction or anti-jitter circuit 12 based on the principles described in the above-referenced co-pending application.

An input waveform or pulse train S is supplied to the circuit. S, which may be generated by any suitable frequency source, such as an oscillator or a frequency synthesiser, and may have been transmitted along an electrical or optical fibre cable or transmitted via electromagnetic waves, has an ideal or nominal pulse repetition or wave frequency f, but may also be subject to phase noise (or, equivalently, time jitter) and to missing pulses or waves.

The input causes a precise monostable 1 to emit a series of pulses M of the same length. These pulses have the direct current (DC) component removed from them by analog addition in addition circuit 2 with a voltage from a DC removal feedback circuit 10. An inverting integrator 3 then converts the series of pulses into a sawtooth waveform N which are compared to a reference level Vref. Vref is advantageously selected to be near to the mean DC level of the integrator output. The output O from a comparator 4 is a series of pulses in which the rising edges occur at regular intervals $T_o$. The rising edges thus have reduced jitter relative to the input waveform S. The signal is then passed to an output (positive edge-triggered) monostable 5 which ensures that the output pulses P have the same frequency f as the input, but low jitter on both leading edge and trailing edge.

The polarity of some or all of the components used (positive edge-triggered monostables, inverting integrator, non-inverting comparator, non-inverting buffer) can be reversed, as can the polarity of the output signal. Additional amplifiers and inverters can also be added, provided that the net polarity inversion of the signal around the feedback loop is the same. These kind of changes will not alter the concept of the circuit.

The DC removal circuit 10 comprises a simple low pass filter comprising a resistor 8 and a capacitor 9, the voltage on which is fed back to addition circuit 2 via the high input impedance non-inverting buffer 7. The circuit block 11 acts as a leading-edge jitter reduction or phase noise reduction circuit referred to in our copending application as a self-adjusting delay compensator or SADC. Other known DC removal circuits could be employed in place of circuit 10.

The timing period of monostable 1 is advantageously chosen to be a small fraction of the waveform period To. This allows higher levels of noise to be suppressed. The timing period of monostable 5 is chosen so that in use the mark-space ratio of the waveforms is not near to 1 or infinity over the frequency range required.

Optional Zener diodes 6 and 6' give fast frequency switching with no loss of pulses. If the integrator output reaches an upper or lower limit set by the Zener diode voltages, which will occur if the input frequency jumps sufficiently high or low, the Zener diodes effectively by-pass resistor 8 and feed charge rapidly directly into capacitor 9. This ensures the new required voltage on capacitor 9 is achieved as soon as possible so that jitter cancellation is restored quickly after a frequency jump, and no input pulses or transitions are lost. This process can be performed equivalently by other circuit variations, for example by means of further comparators, as will be apparent to those skilled in the art.

The jitter reducing action of the circuit is explained with reference to FIGS. 2a to 2d. A train of five pulses M from the input monostable is shown in FIG. 2a with jitter, with one pulse misplaced by time $t_j$. The corresponding integrator output N is shown in FIG. 2b, together with the comparator output O (FIG. 2c) and the output P (FIG. 2d) from the output monostable 5.

The DC removal circuit 10 prevents integrator 3 from drifting towards saturation. Below the cut-off frequency of the DC removal circuit, phase noise is not detected and cannot therefore be cancelled.

Given that the DC component is correctly removed, the operation of the circuit is as follows. It can be seen from FIGS. 2a to 2d that the times at which the comparator 4 is switched on the positive slope of the integrator waveform N are completely unaffected by the time jitter tj on the central pulse in waveform M. The independence of the pulse positive edges in waveform O from time jitter means that the output waveform from the monostable P is jitter free. The circuit has indeed cancelled the time jitter and phase noise on the input waveform and provided a jitter-free waveform at the same average frequency as the input.

Figure 3:
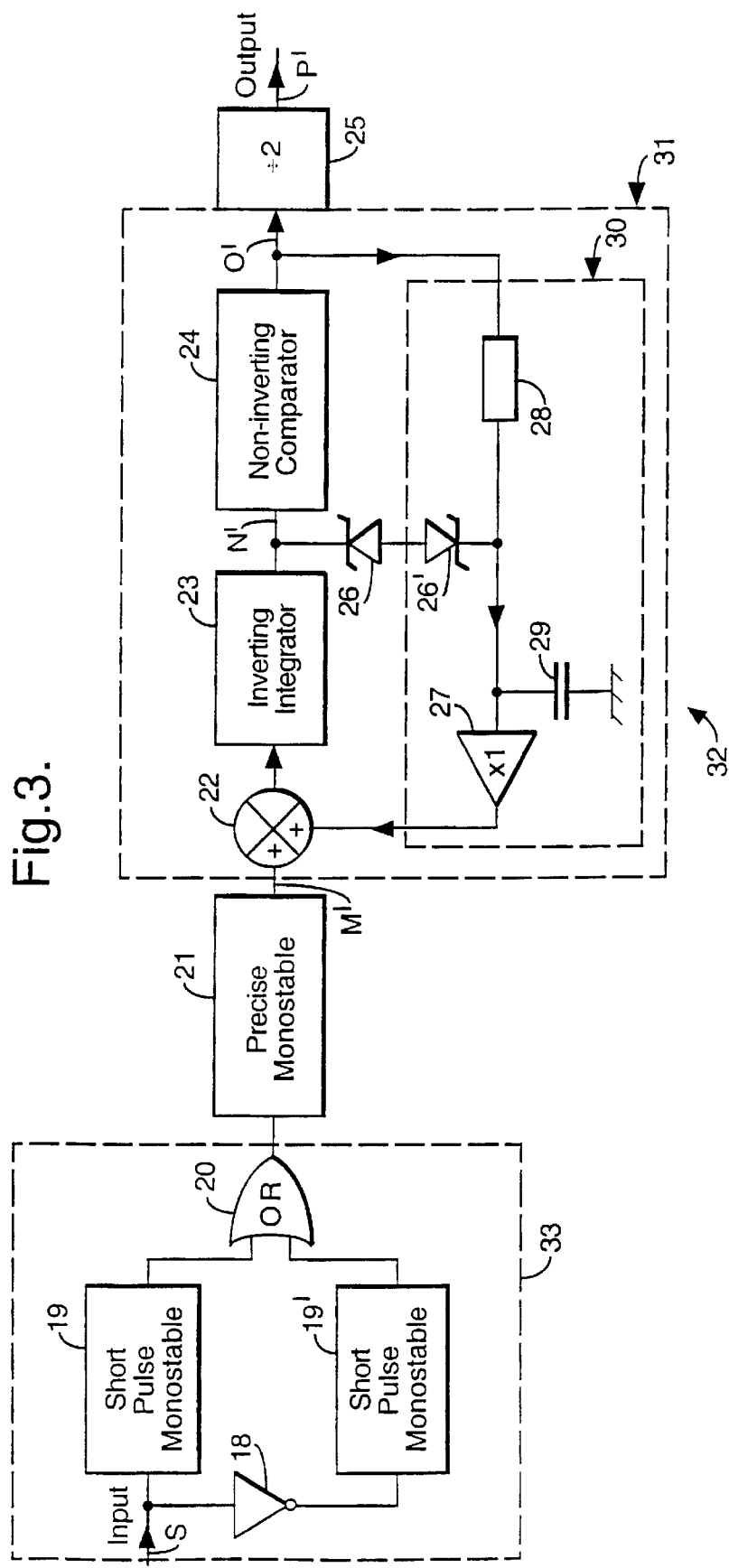
FIG. 3 shows a phase noise reduction circuit according to the invention.

A phase noise reduction or anti-jitter circuit 32 according to one aspect of the present invention is shown in FIG. 3. A frequency doubler arrangement 33 with wider frequency tracking and lower noise can be obtained if two monostables 19,19' are used with an inverter 18 to double the frequency at which the system operates.

In this circuit, the input pulse train or waveform at frequency f causes monostable 19 to emit a short pulse on each rising edge. The effect of the inverter 18 is that the input pulse train causes monostable 19' to emit a short pulse on each falling edge. An OR gate 20 ensures that the short pulses S' from either monostable 19,19' are transmitted to a precise monostable 21. The nominal frequency of S' is double that of the input, i.e. 2f.

This arrangement will work provided that both the 'mark' and the 'space' periods of the input waveform are longer than the short pulse monostable timing period.

The monostable 21 then supplies a train of pulses M' at the nominal frequency 2f of precise length to a SADC 31 of the form already described with reference to FIG. 1. The SADC 31 reduces the time jitter of the rising edges at its output O'. These rising edges are then used to activate a divide-by-two circuit 25, whose output P' is at half the frequency of its input, at nominal frequency f.

Optional Zener diodes 26 and 26' can also be added to circuit 31 and have the same advantages as they have in circuit 10.

FIG. 4(a) illustrates an advantageous design for the short pulse monostables used in circuit 33. Referring to this Figure, the monostable 44 provides a short inverted pulse on a rising edge, even on a slowly rising edge. It comprises two NAND gates 41 and 43 cross-connected as a flip-flop circuit, together with a gate 42 and output inverter 45, whose output consists of a brief pulse, about three times as long as the signal propagation delay through a single NAND gate, on each rising edge. The pulse provided although not necessarily of precise length, is short, and the circuit is easily produced as part of an integrated circuit, which are characteristics useful in practical implementation of circuits according to the invention.

FIG. 4(b) illustrates an advantageous design for two short pulse monostables 19,19', OR gate 20 and inverter 19 needed for the frequency doubler input circuit 33. It conveniently employs eight NAND gates. The NAND gate 46 is used as an inverter (an inverter could be used instead). The NAND gate 47, because its inputs are inverted pulses, acts as an OR gate with a positive pulse for each rising or falling edge.

With the addition of load resistors within and/or between the NAND gates in FIGS. 4a and 4b, the pulse length can be made constant enough for use as a fixed pulse-length monostable in some applications.

Figure 5:
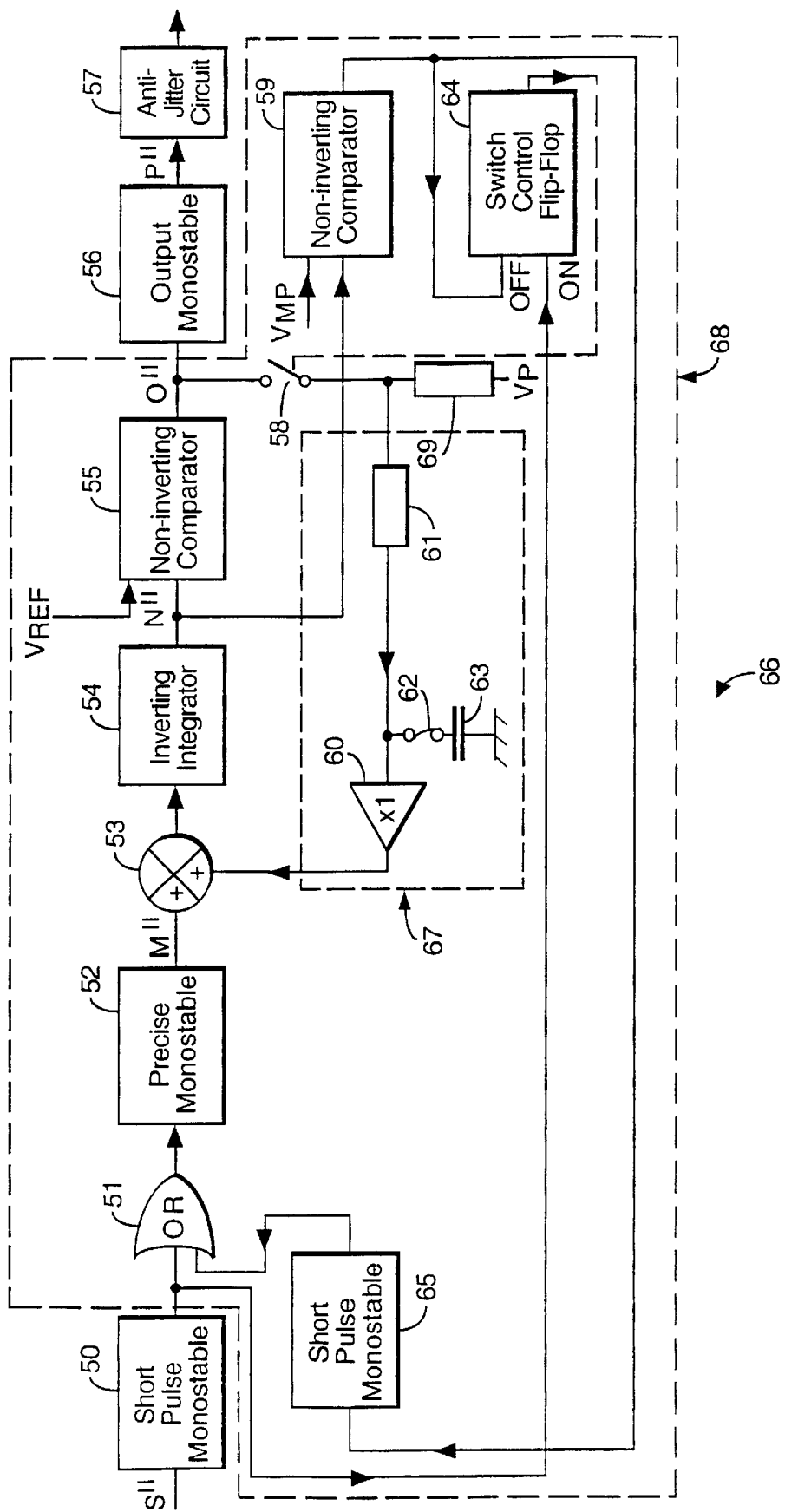
FIG. 5 shows a clock restoration circuit according to the invention.
Figure 6:
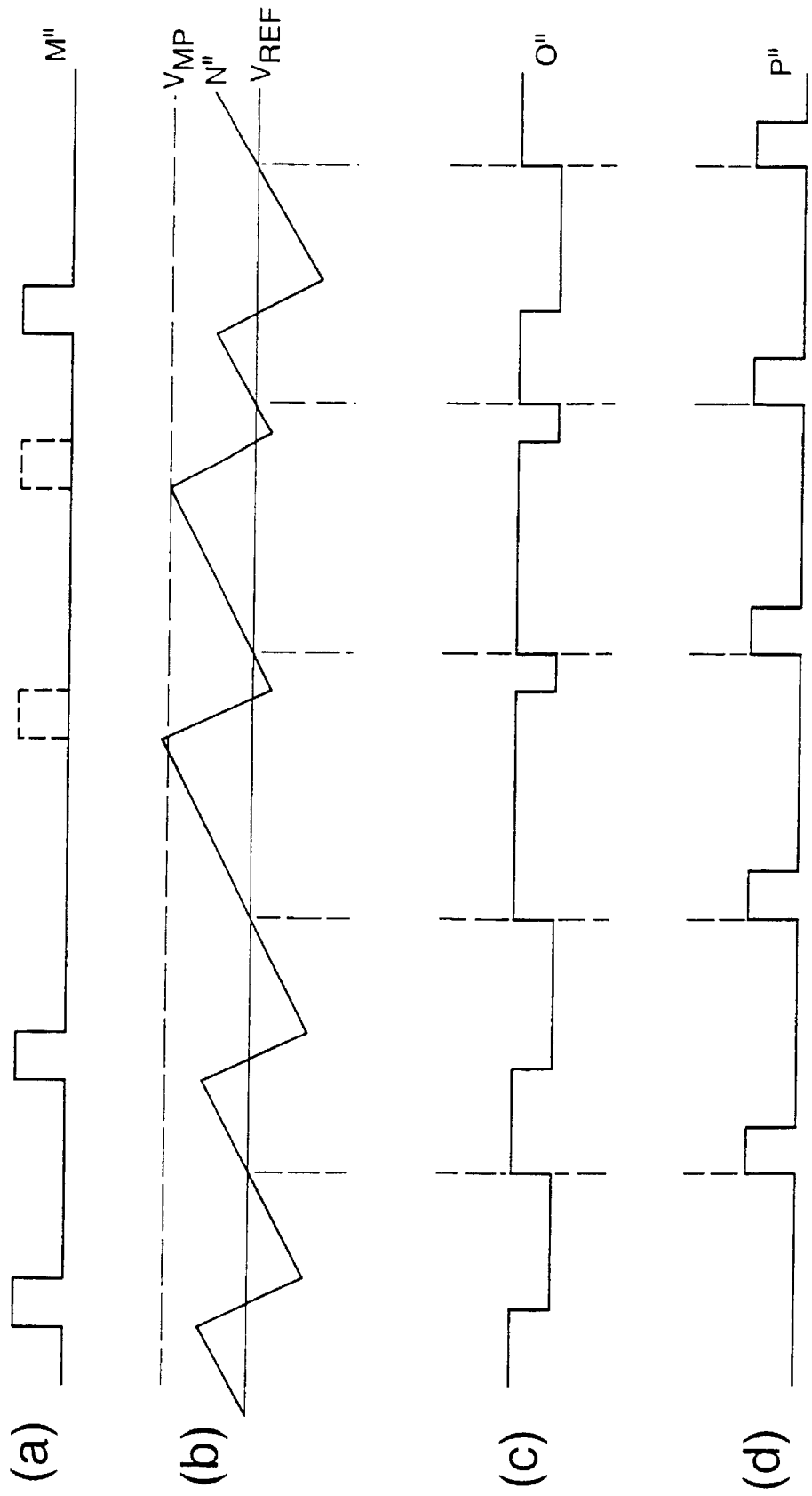
FIGS. 6a to 6d show different waveforms useful in understanding operation of the clock restoration circuit of FIG. 5.

FIG. 5 illustrates a clock restoration circuit which has features in common with the anti-jitter circuits 12 and 32 of FIGS. 1 and 3 respectively, and, in fact, incorporates an anti-jitter circuit in its output signal path.

The circuit has as its input an electrical signal waveform or series of pulses with a predominant periodicity in which individual rising and falling edges are not at precise time intervals, i.e. they are subject to phase noise, and in which individual waves or pulses, or sets of waves or pulses may be missing entirely.

Input pulse train or waveform S" with missing pulses and time jitter is first supplied to short pulse monostable 50, which converts it into a series of short pulses. These are supplied via OR gate 51 to a precise monostable 52 which then converts it to a train of identical pulses M", whose DC level is removed by analogue addition in circuit 53 of a voltage from the DC removal circuit 67. This train of pulses is then integrated by the inverting integrator 54, whose output N" is supplied both to a non-inverting comparator 55 and to a non-inverting comparator 59. Comparator 55 has the effect as in circuits 12 and 32 of reducing time jitter on the rising edges at its output. Similarly, resistor 61, buffer 60 and capacitor 63 have the same function as in circuits 12 and 32 of subtracting the DC component of the signal M".

Comparator 59 has a trigger level $V_{mp}$ set higher than the trigger level $V_{ref}$ of comparator 55. The level $V_{mp}$ is above the highest level of the integrator waveform which can exist during normal operation of the circuit on an input frequency source with no missing input pulses or pulse transitions.

The comparator 59 therefore only produces an output when an input pulse (or series of input pulses) is missing. Then the comparator 59 causes a missing pulse to be inserted by short pulse monostable 65 into the OR gate 51 in place of the pulse which should have arrived from the input via monostable 50.

In this way the output pulse train is reconstituted with the or each reinserted pulse being delayed relative to the timing of the missing pulse. The circuit is capable of inserting long trains of pulses when several input pulses are absent. The waveforms that occur as this happens are illustrated in FIGS. 6a to 6d.

Finally, the optional anti-jitter circuit 57 constructed in a similar way to circuit 12 or circuit 32 described hereinbefore operates on the train of output pulses and removes any residual phase jumps due to the delay of any reinserted pulses. The anti-jitter circuit 57 will also remove any phase-jitter already present in the input pulse train. If the system in which the clock restoration circuit is to operate is not affected by the phase jumps or time shifts caused by reinsertion of missing pulses or by any phase noise already present, then the anti-jitter circuit 57 may be omitted.

If a long sequence of input pulses is missing the circuit continues to operate at the original input frequency for a time not exceeding the time constant of the DC removal circuit. This time can be considerably increased by an optional arrangement, also shown in FIG. 5.

This optional arrangement comprises a switch 58 and a flip-flop switch control circuit 64. The switch control circuit 64 is connected to switch 58, which could be a high speed FET switch or other electronic switch. In the event of missing pulses (if the integrator output rises above the $V_{mp}$ level) the flip-flop acts as a control for the switch, switching it off and causing the voltage on capacitor 63 to be held constant. If switch 58 is left connected all the time, the inserted frequency will slowly drift downwards at an exponentially decreasing rate. The reset of the switch control circuit 64 is derived from the pulse output of the input monostable 50. The switch control circuit 64 reconnects the feedback when an input pulse next occurs.

There may be circumstances in which it is desirable to allow a drift in frequency of the inserted pulses towards a particular frequency $F_p$, which could be achieved by the addition of optional resistor 69 and voltage input $V_p$. Because of the low output impedance of comparator 55, the current through resistor 69 will typically be acceptably low. Optionally, switch 58 could be arranged to be a change-over switch, switching the input end of resistor 61 between the comparator 55 output and the resistor 69.

The circuit block marked 68 constitutes a missing pulse insertion circuit, which could be used as a subsystem in other circuits.

Figure 7:
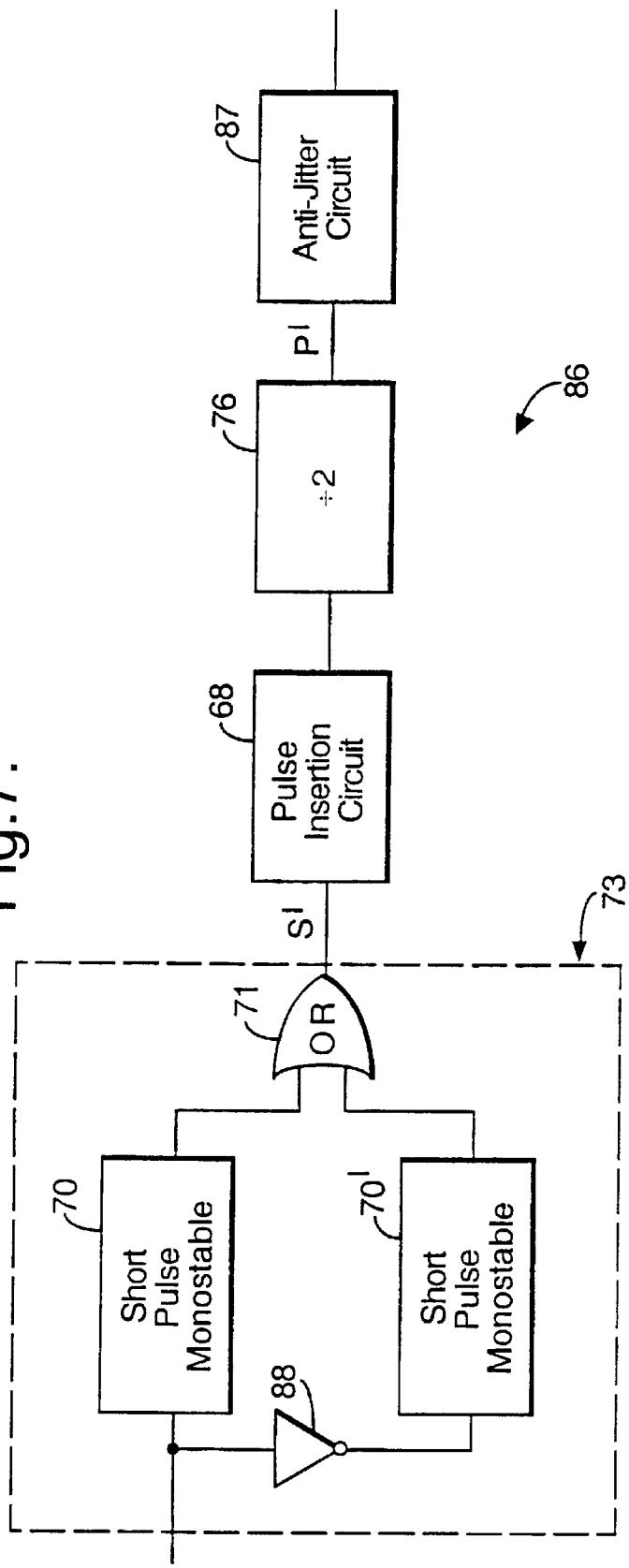
FIG. 7 shows another clock restoration circuit according to the invention.

An alternative clock restoration circuit 86 is shown in FIG. 7. Like circuit 32, this operates internally at frequency 2f. As before, the assembly 73 consisting of circuit elements 70,70',71 and 88 acts as a frequency doubler circuit in the same way as circuit 33, and outputs a signal at double the input frequency f. The pulse insertion circuitry 68 described with reference to FIG. 5 inserts an extra pulse or pulses at its output. The rising edges of these pulses are then used to activate a divide-by-two circuit 76, whose output P' is at half the frequency of its inputs, i.e. at nominal frequency f. As with circuit 66 of FIG. 5, circuit 86 may optionally include an anti-jitter circuit 87 to reduce the time jitter of its output signal.

It can be seen that the circuits 66 and 86 of FIGS. 5 and 7 respectively will continue to operate or oscillate at the last frequency present at the input, if the input frequency source is suddenly removed.

Further inspection reveals that the voltage on the buffer 60 controls the frequency of operation. Thus in the absence of any input, the input signal to buffer 60 (perhaps after breaking a link 62 either with an electronic switch or mechanical device) can be used as an input to control the output frequency. In this way the circuit operates as a low time jitter (low phase noise) voltage controlled oscillator. The second anti-jitter circuit 57 is optional, but it is desirable to attain the lowest possible phase noise.

Furthermore if the voltage on the buffer 60 is preset to give or biassed towards giving an output frequency equal to an improper fractional multiple of the actual input frequency, the circuit very rapidly 'locks on'. An improper fraction is the ratio of 2 whole numbers where the numerator is larger than the denominator.

The circuit will remain locked on precisely to the selected multiple of the input frequency and remains locked to this multiple even if the input frequency varies over a substantial range. In this way the clock restoration circuit can be operated as a versatile frequency multiplier. In this case the second anti-jitter circuit can be used to equalise the pulse spacing and remove the phase timing jumps which occur for those pulses reinserted between the actual input clock pulses.

Finally, in the case of multiple periodicities, the circuit may be arranged to lock on to selected spectral components of the input signal corresponding to a specific periodicity. This is achieved by preconditioning the circuit with a pulse train of the desired periodicity or presetting the voltage on the capacitor 63.

In accordance with another aspect of the invention, the noise reduction circuit is effective to delete from the input pulse train spurious additional pulses; that is, pulses additional to pulses at the nominal input frequency f. As before, the noise reduction circuit may include an anti-jitter circuit to reduce or eliminate time jitter in the pulse train. Noise reduction circuits in accordance with this aspect of the invention are now described, by way of example with reference to FIGS. 8 to 15.

Figure 8:
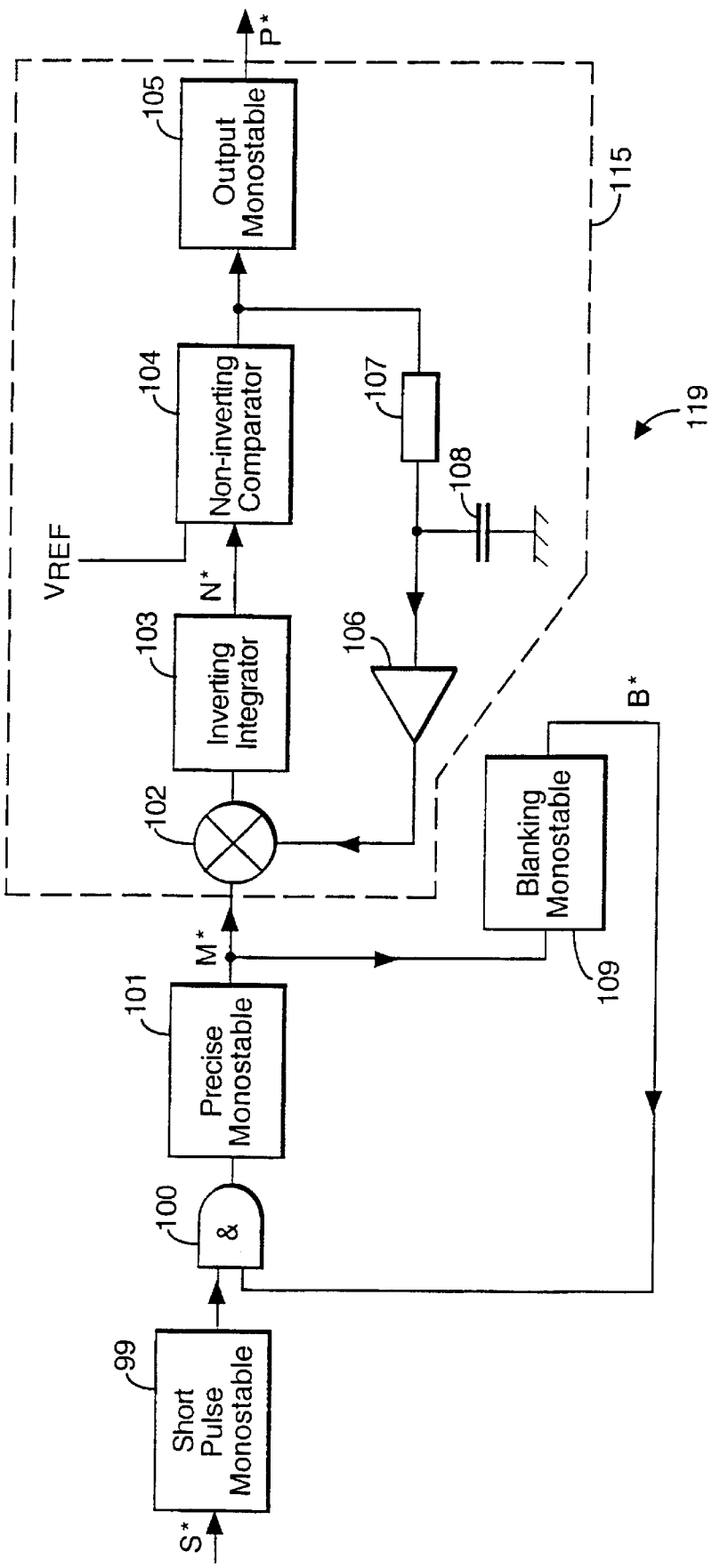
FIG. 8 shows a clock restoration circuit according to the invention.

FIG. 8 illustrates a clock restoration circuit 119 having features in common with the anti-jitter circuits 12 and 32 described with reference to FIGS. 1 and 3 respectively. Circuit 119 will reduce or eliminate time jitter and it is also effective to delete spurious additional pulses that may be present.

It will be assumed that an input pulse train or waveform S* is subject to time jitter and also contains spurious additional pulses.

The input pulse train or waveform S* is first taken to AND gate 100 and then to precise monostable 101, which converts it into a series of pulses M* of identical length. It will be understood that the technical requirements for the "precise monostable" are not stringent, i.e. the output pulse from the precise monostable must simply be repeatable and be the same irrespective of the length or adjacency of the input pulses. Optionally, a short pulse monostable 99 is used to provide a defined logic pulse, for example, where the input pulse train may be a sine wave or a slowly rising or falling analogue signal. The trailing edge of the precise monostable 101 causes blanking monostable 109 to generate a pulse of a length less than (but advantageously nearly equal to) a time period Tr which is equal to the nominal time period T of the pulse train or waveform less the pulse length Tp of the precise monostable 101. Alternatively, the leading edge of the output of the precise monostable 101 is used to cause the blanking monostable 109 to generate a pulse of length Tr less than (but advantageously nearly equal to) a time period Tr which is equal to the nominal time period T. The closer Tr is to its maximum value, the more spurious pulses will be deleted. However, the maximum upward change in input frequency that can be tolerated will be smaller.

Each blanking monostable pulse in pulse train B* inhibits further input pulses for period Tr using the AND gate 100. The components 102,103,104,105,106,107 and 108 constitute an anti-jitter circuit (AJC) 115 whose function is described earlier. The effect of the anti-jitter circuit 115 is to remove jitter from the pulse train M*.

The monostable 109 and the AND gate 100 will remove from the input pulse train spurious additional after-pulses; that is, pulses occurring after the expected pulses in the input pulse train. These after-pulses are removed without degradation of the pulse train. However, spurious additional before-pulses (that is, pulses occurring before the expected pulses) will result in the removal of expected pulses. In this case, the resultant pulse train M* will contain pulses jittered to positions in advance of their correct positions. However, the AJC 115 will remove this jitter, thus restoring the pulse train M* to a regular series of pulses P*.

Figure 9:
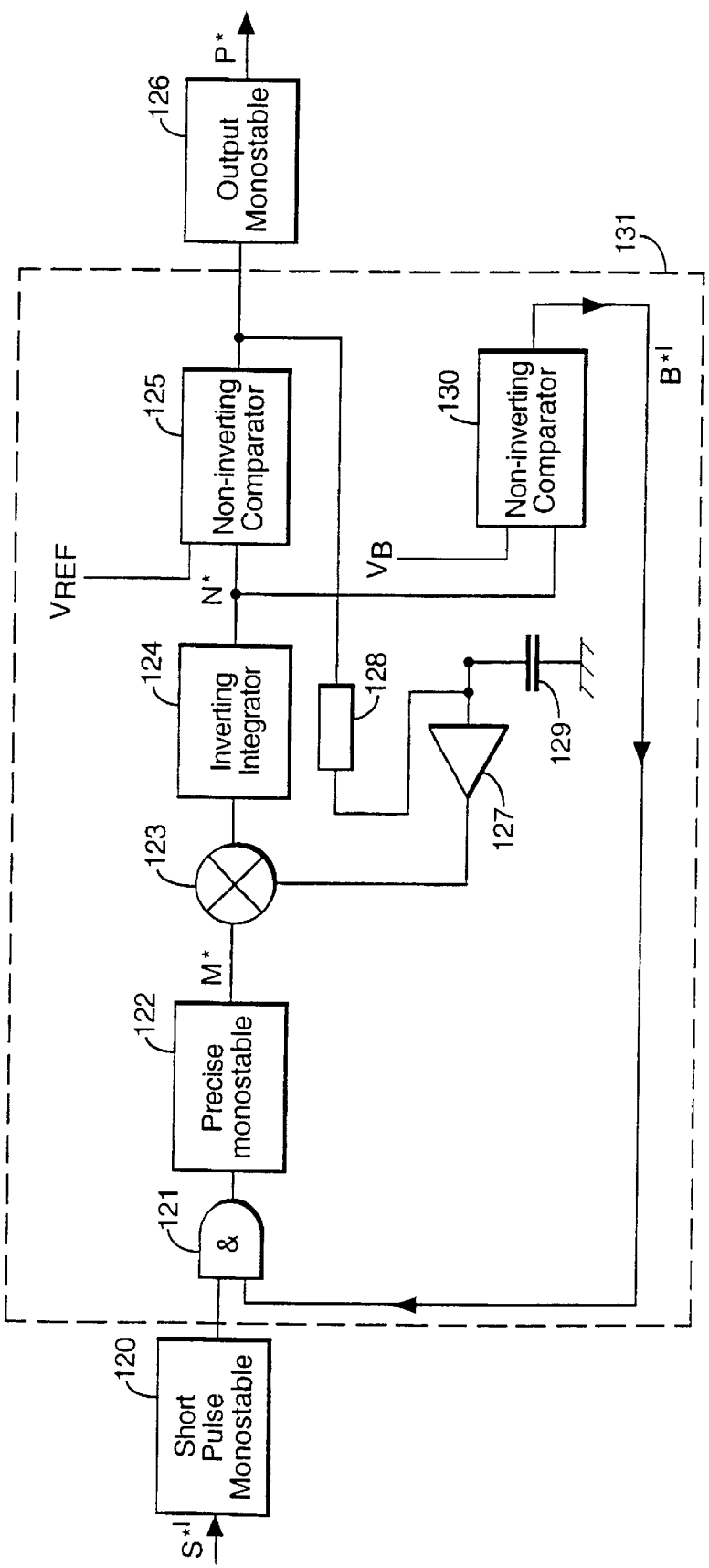
FIG. 9 shows an alternative clock restoration circuit according to the invention.
Figure 10:
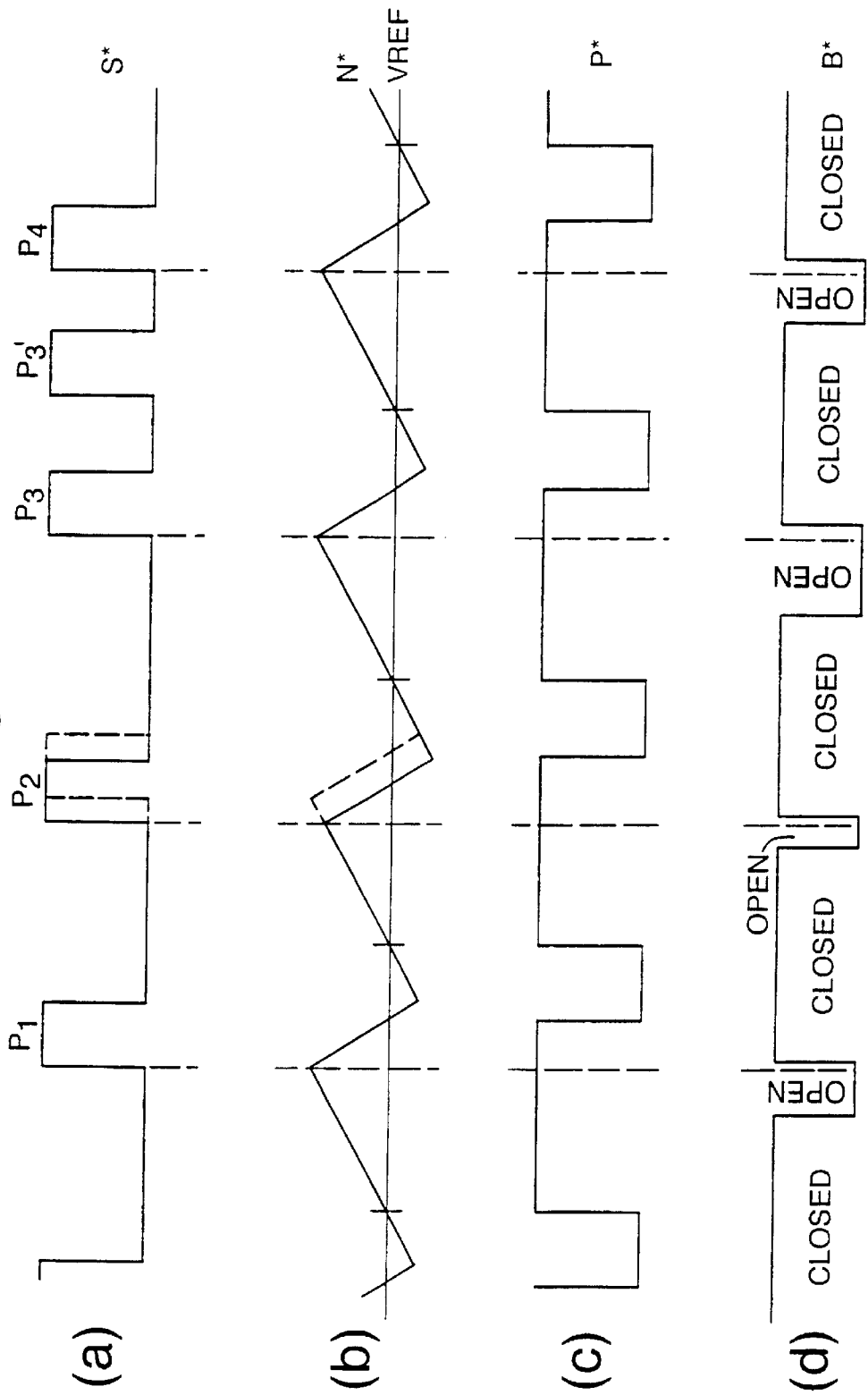
FIGS. 10(a) to 10(d) show voltage waveforms observed at different points in the circuit of FIG. 9.

FIG. 9 illustrates an alternative circuit 131 which is also effective to delete spurious additional pulses and to have an anti-jitter effect. In circuit 131 input pulses S*' are first optionally converted into short pulses by short pulse monostable 120, and then passed via AND gate 121 to the precise monostable 122. Components 122 to 124 function as an anti-jitter circuit.

However, the output of the integrator 124 in this circuit has a dual function; that is, it controls a non-inverting blanking comparator 130 which is used to generate blanking pulses B*' which delete extra pulses via the AND gate 121. The blanking pulses B*' generated are shorter for higher frequency input pulse trains S*' and longer for lower frequency input pulse trains S*'. The duty cycle of pulse train B*' is selected by a voltage $V_B$ applied to the comparator 130. As before, the anti-jitter circuit elements act to remove jitter which may already be present in the input pulse train and which may be created as a result of pulse deletion.

Circuit 131 has the advantage over circuit 119 that it can deal with input pulse trains S*' over a wider input frequency range and with higher jitter values.

FIGS. 10a to 10d show waveforms which can be seen at various points of the circuit 119. In the described example, the waveform S* (FIG. 10a) contains a jittered (forward-displaced) pulse P2 and an additional spurious pulse P3' (an after-pulse). The integrator output waveform N* (FIG. 10b) is shown, together with the output P* (FIG. 10c) and the train of blanking pulses B* (FIG. 10d). The waveforms seen in the alternative circuit 131 are similar except that the blanking pulses are of variable length (this can be seen in FIGS. 12a to 12d).

Figure 11:
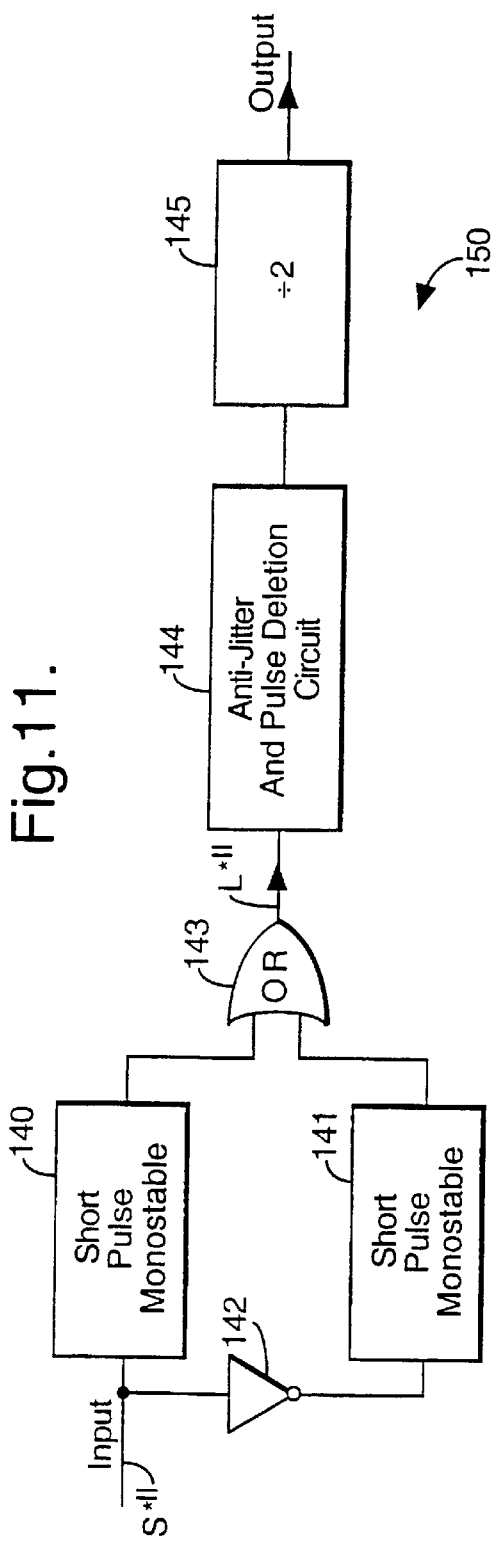
FIG. 11 shows an anti-jitter and spurious pulse deletion circuit having a frequency doubling input.

FIG. 11 shows an anti-jitter and spurious pulse deletion circuit 150 which has a frequency doubler input. The frequency doubler input comprises short pulse monostables 140 and 141, inverter 142 and OR gate 143. An anti-jitter and pulse deletion circuit 144 based on the circuit 131 is used to process the pulse train and its output is fed to a divide-by-two circuit 145 to produce an output pulse train having the same nominal frequency as the input pulse train S*. Typical waveforms in the circuit are shown in FIGS. 12a to 12d. The pulse train S*" may have a mark-space ratio not equal to 1:1, and this would be a problem for circuits of the type referenced 119 because they produce a pulse train such as L*" at the input to circuit 144. However, circuits of the type referenced 131 can deal with this kind of pulse train, because the blanking comparator generates a blanking waveform B*" from the integrator output N*" which has longer blanking pulses during the longer intervals and shorter blanking pulses during the shorter intervals of the waveform.

Figure 13:
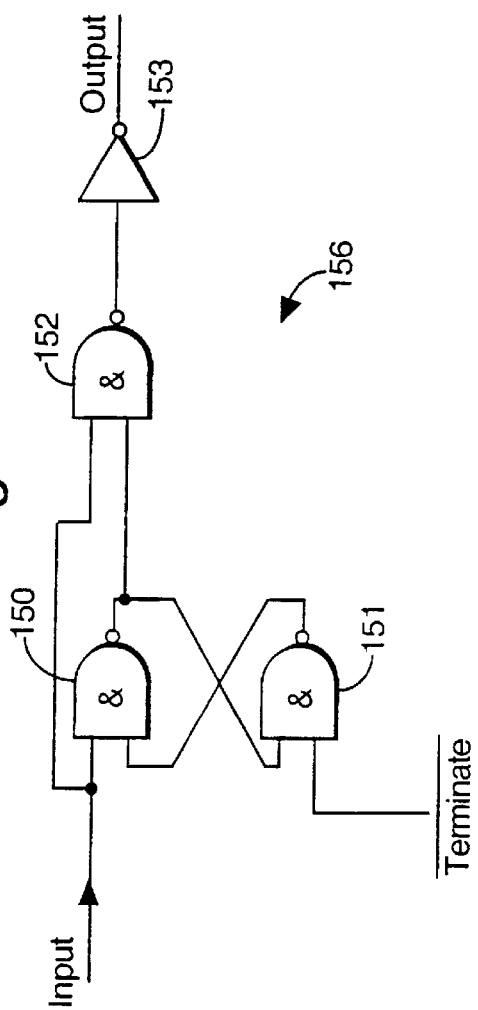
FIG. 13 shows a latch circuit.
Figure 12:
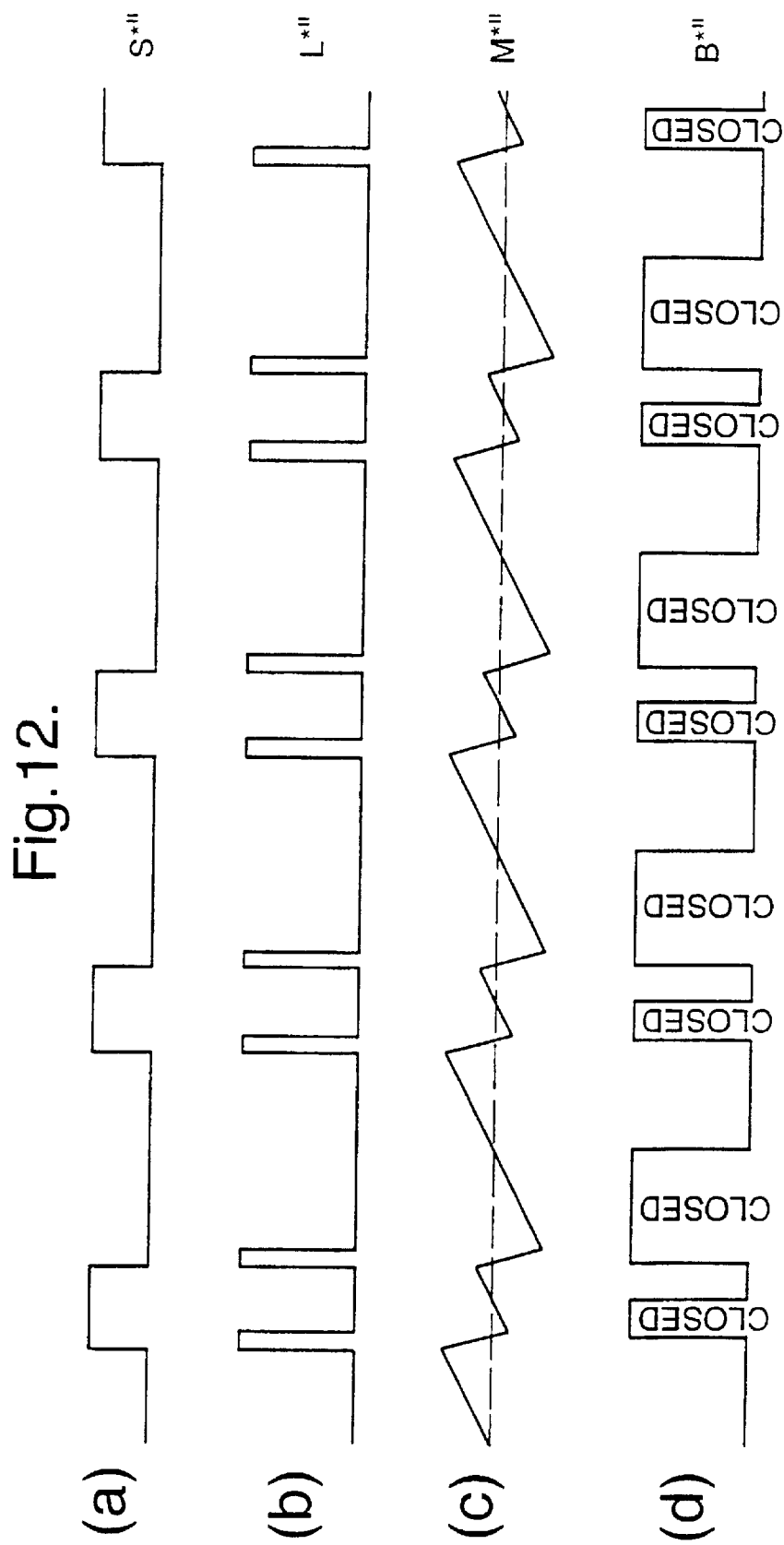
FIGS. 12(a) to 12(d) show voltage waveforms observed at different points in the circuit of FIG. 11.

FIG. 13 shows a special latch circuit 156 having a "terminate" input. Circuit 156 can be used as an alternative to adding AND gates 100 and 121 shown in FIGS. 8 and 9 respectively. Circuit 156 is similar to circuit 44 described with reference to FIG. 4a and may optionally replace the function of short pulse monostable circuits 99 and 120 described with reference to FIGS. 8 and 9 respectively. A circuit of the kind having the function of a short-pulse monostable circuit is described in UK Patent No. 1462408.

Circuit 156 includes NAND gates 150, 151 and 152 and an inverter 153. The positive input signal pulse is transmitted to the output until a terminate signal is received back, when the output goes to logic low. The circuit 156 has a negative logic terminate signal, i.e. a signal normally at logic 1 which on its transition to 0 terminates the output pulse.

Figure 14:
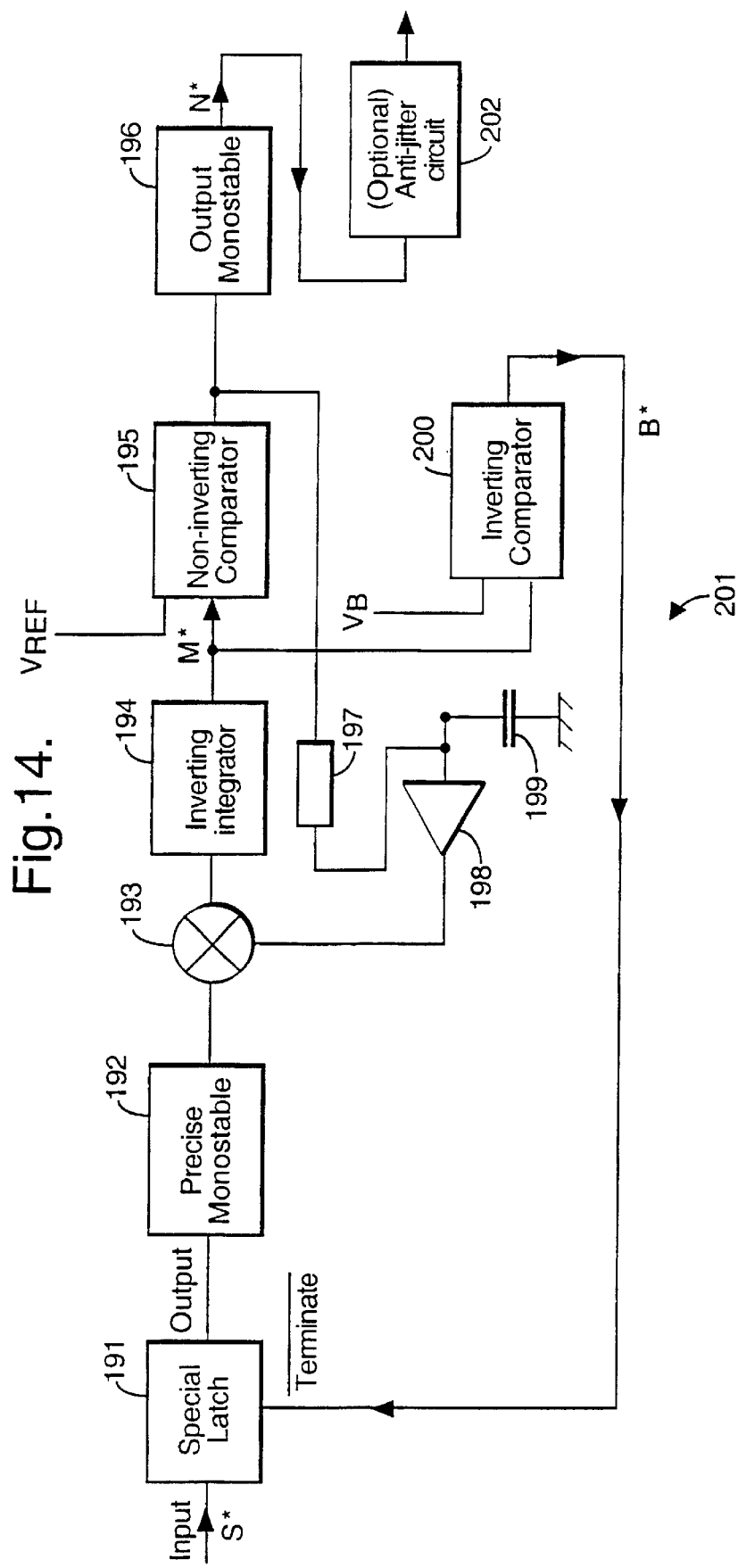
FIG. 14 shows a clock restoration circuit incorporating the latch circuit of FIG. 13.

In the case of circuits 119 and 131, the short-pulse monostable circuits 99 and 120 and the AND gates 100 and 121 are replaced by latch circuits of the kind described, and the blanking pulses B*,B*' are fed to the terminate input via an inverter. In the case of circuit 150, each short-pulse monostable circuit 140,141 is replaced by a respective latch circuit 156 and inhibit pulse trains are supplied to the terminate input of the latch circuits via an inverter. FIG. 14 shows circuit 156 applied to the circuit 131 described earlier with reference to FIG. 9. Latch circuit 191 is the same circuit as circuit 156 and replaces short-pulse monostable 120 and AND gate 121 shown in FIG. 9, whereas the other components 192 to 200 have the same function as components 122 to 130.

Figure 15:
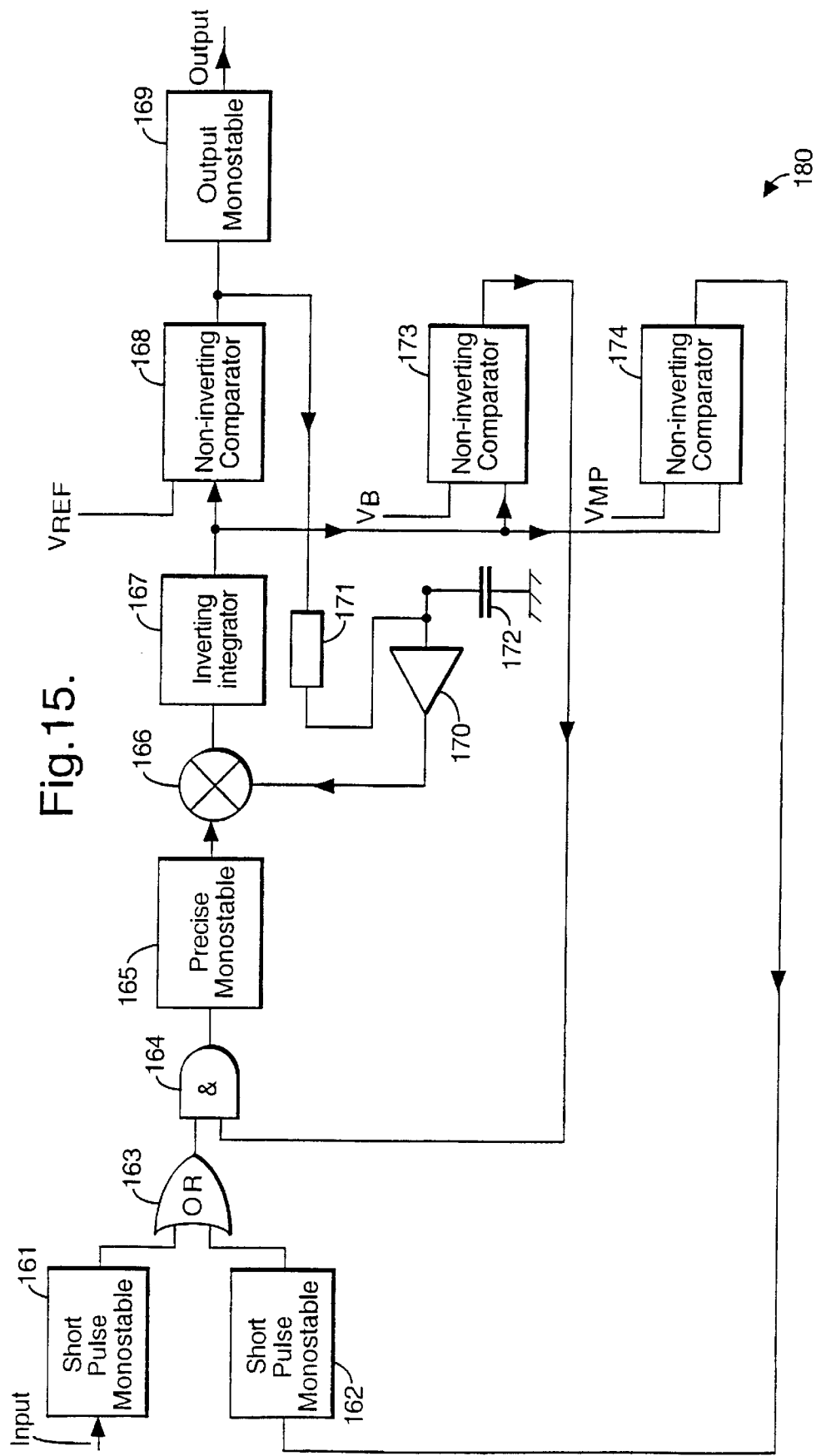
FIG. 15 shows another clock restoration circuit.

FIG. 15 shows a clock restoration circuit 180 which has anti-jitter, spurious pulse deletion and missing pulse insertion functions. The OR gate 163 takes input pulses from optional monostable 161 and inserted pulses from monostable 162. Some of these pulses are inhibited by the pulse train from blanking comparator 173 via AND gate 164. Precise monostable circuit 168 generates pulses of constant length. Monostable 165, along with summation circuit 166, inverting integrator 167, comparator 168, amplifier 170, resistor 171, capacitor 172 and output monostable 169 constitutes an anti-jitter circuit. Pulse insertion functionality is provided by non-inverting comparator 174 whose inputs are a reference voltage $V_{mp}$ and the integrator output. The output of comparator 174 results in inserted pulses being added when necessary by short pulse monostable 162. Pulse deletion functionality is provided by non-inverting comparator 173 whose inputs are a reference voltage $V_B$ and the integrator output. The output of comparator 174 results in spurious additional pulses being deleted via AND gate 164.

The circuit 180 could optionally be equipped with a frequency doubler input circuit as used in circuits 32 and 150 described with reference to FIGS. 3 and 11 respectively.

In another embodiment two pulse deletion circuits of the kind described are used. One acts on an input waveform and another acts on the inverse of the input waveform. The output pulse trains from the pulse deletion circuits are fed to different divide-by-two circuits whose outputs are combined in an OR gate to form a single, common output. Alternatively, the output pulse trains from the pulse deletion circuits could be fed to the set and reset inputs of a flip-flop circuit whose output forms a single, common output.

The circuit 180 optionally includes components for inserting many pulses as used in the pulse insertion circuit 66 described with reference to FIG. 5. These components which include a switch control flip-flop 64, a switch 58 and additional resistor 69 have been omitted from FIG. 15 for clarity.

The circuits 119, 131, 150 and 180 should achieve a reasonably low jitter output. The inserted and deleted pulses, which would give rise to large jitter values, are restored, and jitter due to the misplacement of the inserted or deleted pulses will be intrinsically reduced. However, an additional anti-jitter circuit may optionally be added to the output line of any of circuits 119, 131, 150 and 180 further to reduce the jitter value of the output pulse train and, by way of example, is referenced at 202 in FIG. 14.

In all the circuits herein described, variations will be apparent to those skilled in the art of electronic circuits which do not vary materially from the invention. For example, sets of logic gates may be replaced with alternative sets which have the same mathematical function (Boolean logic function) as the invention.

Circuits 119, 131, 150, 180 and 201 will find application in the restoration of clock signals and other regular pulse trains from communications circuits subject to noise, interference, crosstalk or other problems which cause spurious additional pulses and jitter to occur.

In some applications involving clock signals it is necessary to provide a single clock signal which although having a fixed nominal frequency has an adjustable phase and/or mark-space ratio relative to an input pulse train. In other applications, it is necessary to provide two or more clock signals which have the same nominal frequency but different phases and/or mark-space ratios relative to each other and/or the input pulse train. Another aspect of the invention provides noise reduction circuits for use in such applications, e.g. multi-phase, multi-output clock distribution circuits.

Figure 16:
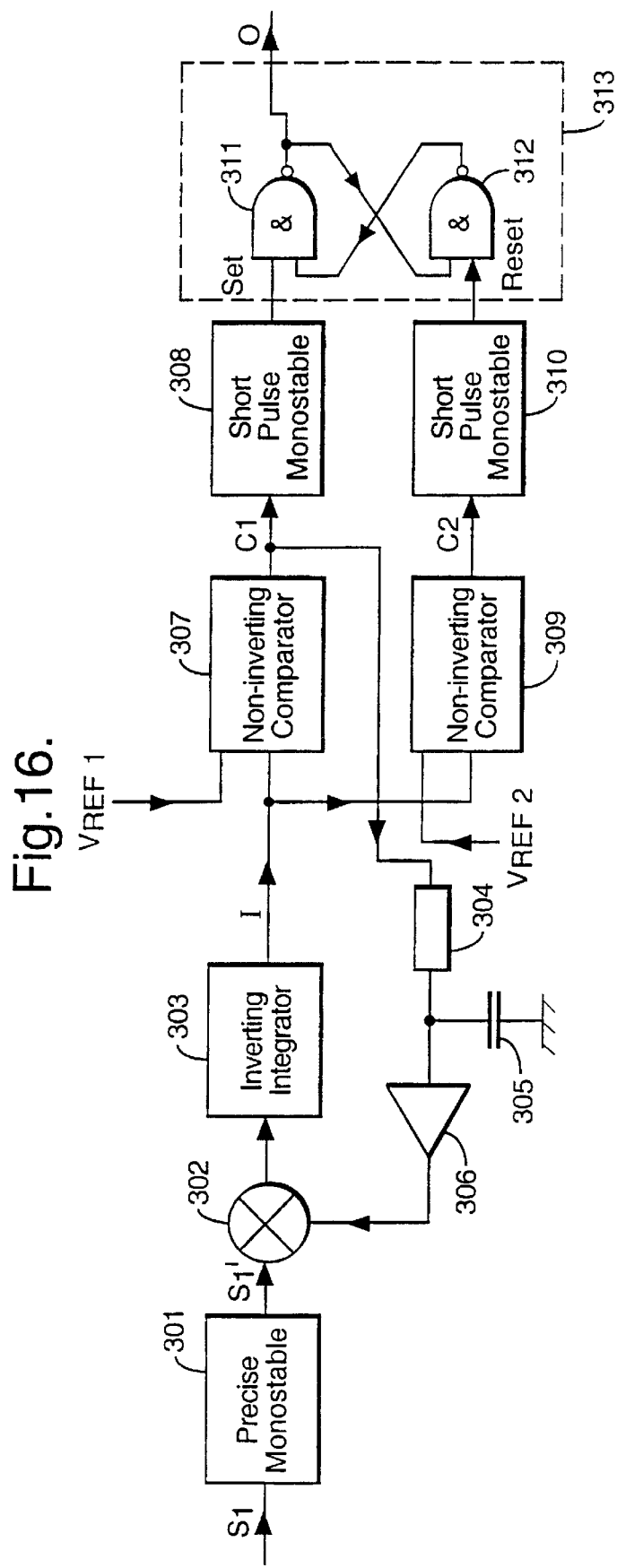
FIG. 16 shows a phase noise reduction circuit according to the invention.
Figure 17:
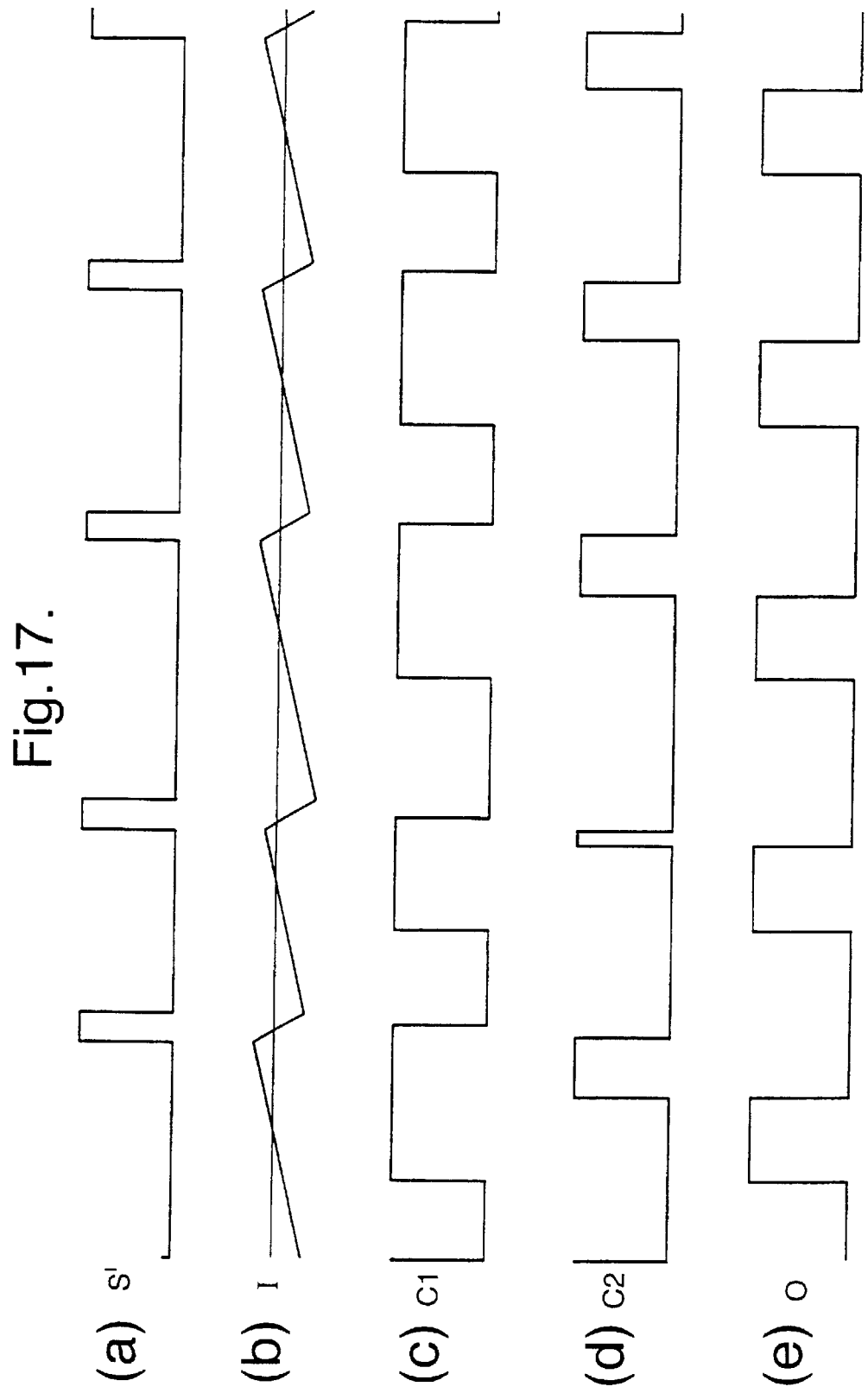
FIGS. 17(a) to 17(e) show voltage waveforms observed at different points in the circuit of FIG. 16.

FIG. 16 illustrates a phase noise reduction circuit for producing a single clock signal. This circuit employs a dual comparator set/reset latch output section.

FIGS. 17a to 17e illustrates voltage waveforms observed at different points in the circuit of FIG. 16.

Referring to FIG. 16, a pulse train $S_1$ is input to monostable 301, which converts $S_1$ to a train of pulses $S_1'$ each the same length (monostable 301 can be omitted if the input pulse train already has pulses of identical length). The pulse train $S_1$40 then feeds an inverting integrator 303 via a summation circuit 302 which acts to subtract the DC component of $S_1'$. The output I of the integrator 303 feeds two comparators 307 and 309. Comparator 307 feeds a DC level subtraction circuit comprising resistor 304, capacitor 305, amplifier 306 and summation circuit 302.

Comparators 307 and 309 also feed their comparison signals C1 and C2 respectively to short-pulse monostables 308 and 310. On each rising edge of C1 and C2 a short inverted pulse is generated which either sets (C1) or resets (C2) respectively a set-reset latch 313, comprising cross-connected NAND gates 311 and 312. The short-pulse monostables could be conventional integrated circuit monostable blocks, or alternatively they could be of the form described in UK Patent No. 1462408. In some cases, the short pulse monostables 308,310 could be replaced by a simple AC coupling capacitor.

To speed up the circuit's response to changes in input frequency, a speed up circuit such as that described with reference to FIGS. 1 and 3 may be used. This would comprise two series back-to-back Zener diodes connected from the output of the integrator 303 to the input resistor 304 of the DC level subtractor circuit. Because the rising edges of C1 and C2 are both jitter free, as a result of the anti-jitter action of components 301,302,303,304,305,306 and 307 the output signal O will be free of jitter on both its leading and trailing edges.

The duty cycle and phase relationship between the input pulse train $S_1$ and the output pulse train O is selected by the voltages $V_{ref1}$ and $V_{ref2}$ applied to the comparators 307, 309 respectively.

The described circuit arrangement has the advantage that it has reduced jitter on both the leading and trailing edges. It has the advantage that it can deal with input pulse trains over a wider input frequency range without the need for a frequency doubler at the input and a divide-by-two circuit at the output. It has the additional advantage that, because the amplitude of the sawtooth waveform output by integrator 303 reduces at lower frequencies, the intervals between the triggering times of the comparators will grow as the frequency falls. Thus the mark-space ratio stays at least approximately constant with frequency changes.

Figure 18:
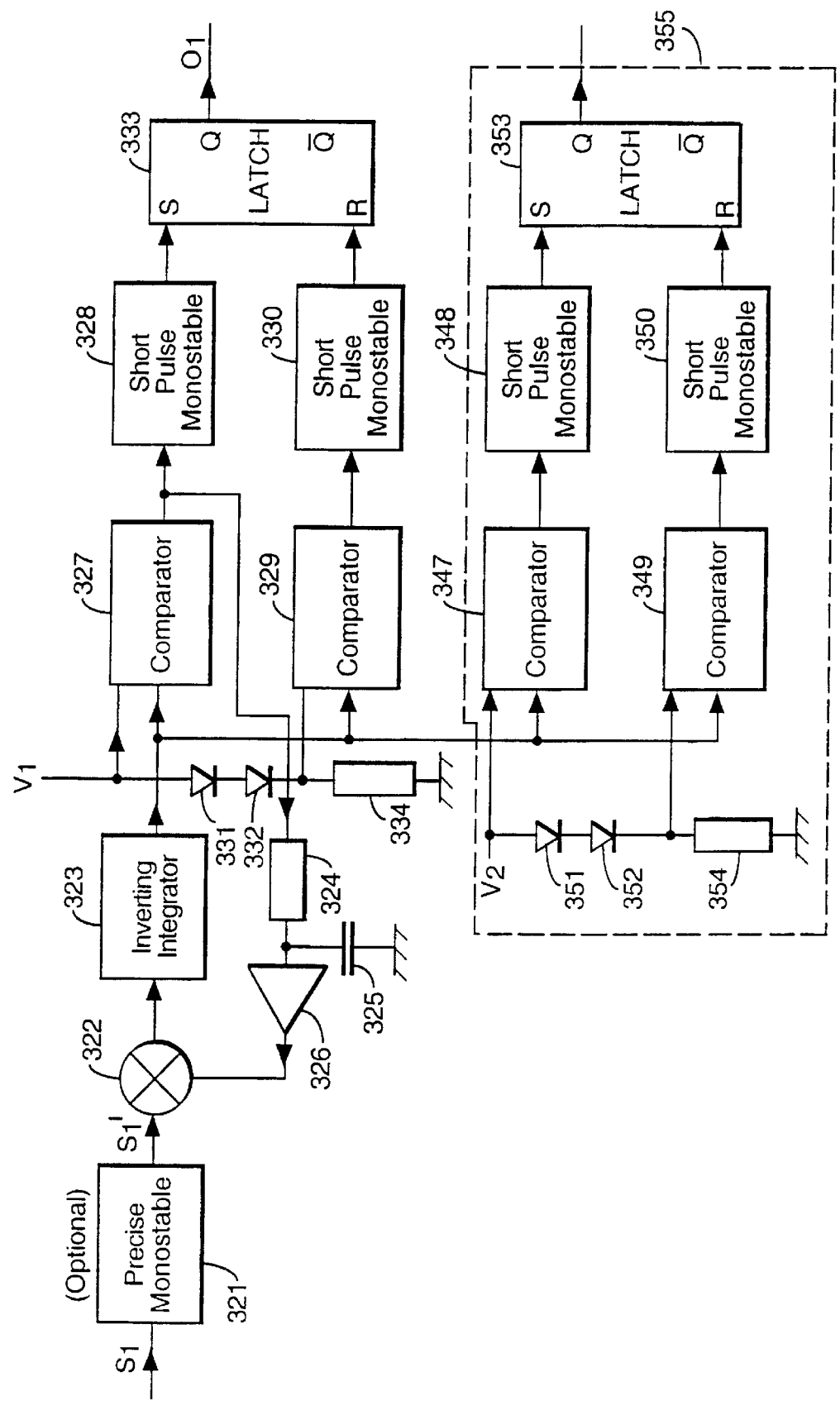
FIGS. 18 and 19 show alternative phase noise reduction circuits.

FIG. 18 shows an anti-jitter circuit which is capable of producing multiple phase outputs, for example multiphase clock signals. Components 321,322,323,324,325,326,327 form an anti-jitter circuit providing leading-edges free from jitter from the input signal. The comparators 327 and 329 feed short-pulse monostables 328 and 330 in order to set and reset the latch 333, whose output $O_1$ is the first output of the circuit, as in the case of FIG. 16. One or more additional outputs can be provided by the addition of one or more additional circuit, of which only one referenced 355, is shown. Circuit 355 contains comparators 347,349, short-pulse monostables 348,350 and an output latch 353. By selecting the input reference voltages to the comparators the outputs of the or each circuit 355 can be controlled with respect to duty-cycle and relative phase. In some applications it is convenient to provide pulses of a standard length from all the outputs of a multiphase clock generator, whilst being able to control the relative phase. This possibility can be provided in a simple way by feeding reference voltages to the pairs of comparators by means of a circuit such as that of the optional diodes 351 and 352 and optional resistor 354 which maintain a fixed difference in voltage between the two, based on a supplied control voltage V2. The circuit described with reference to FIG. 18 is advantageous in that it can operate over a wide range of input frequencies.

Figure 19:
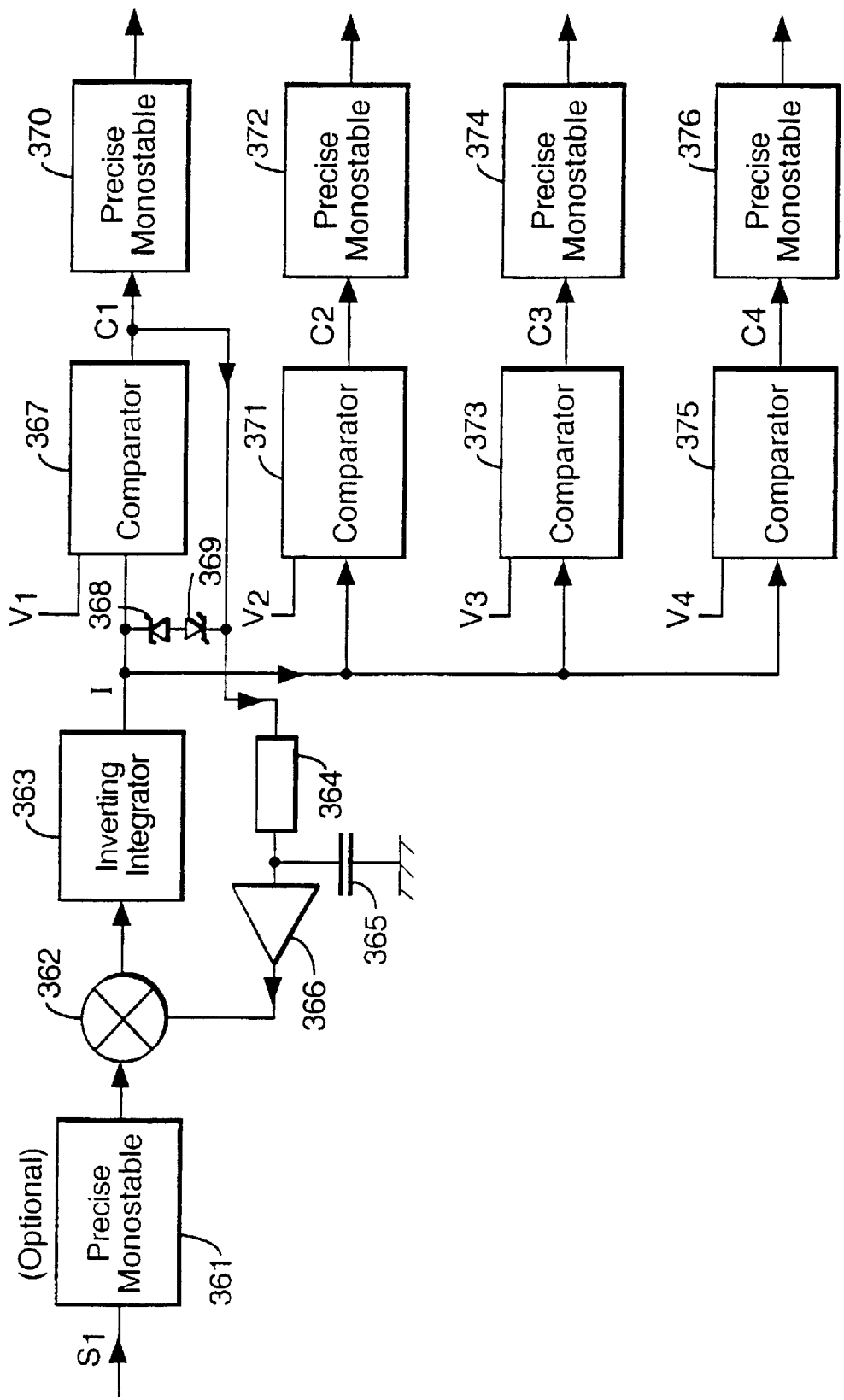
Figure 20:
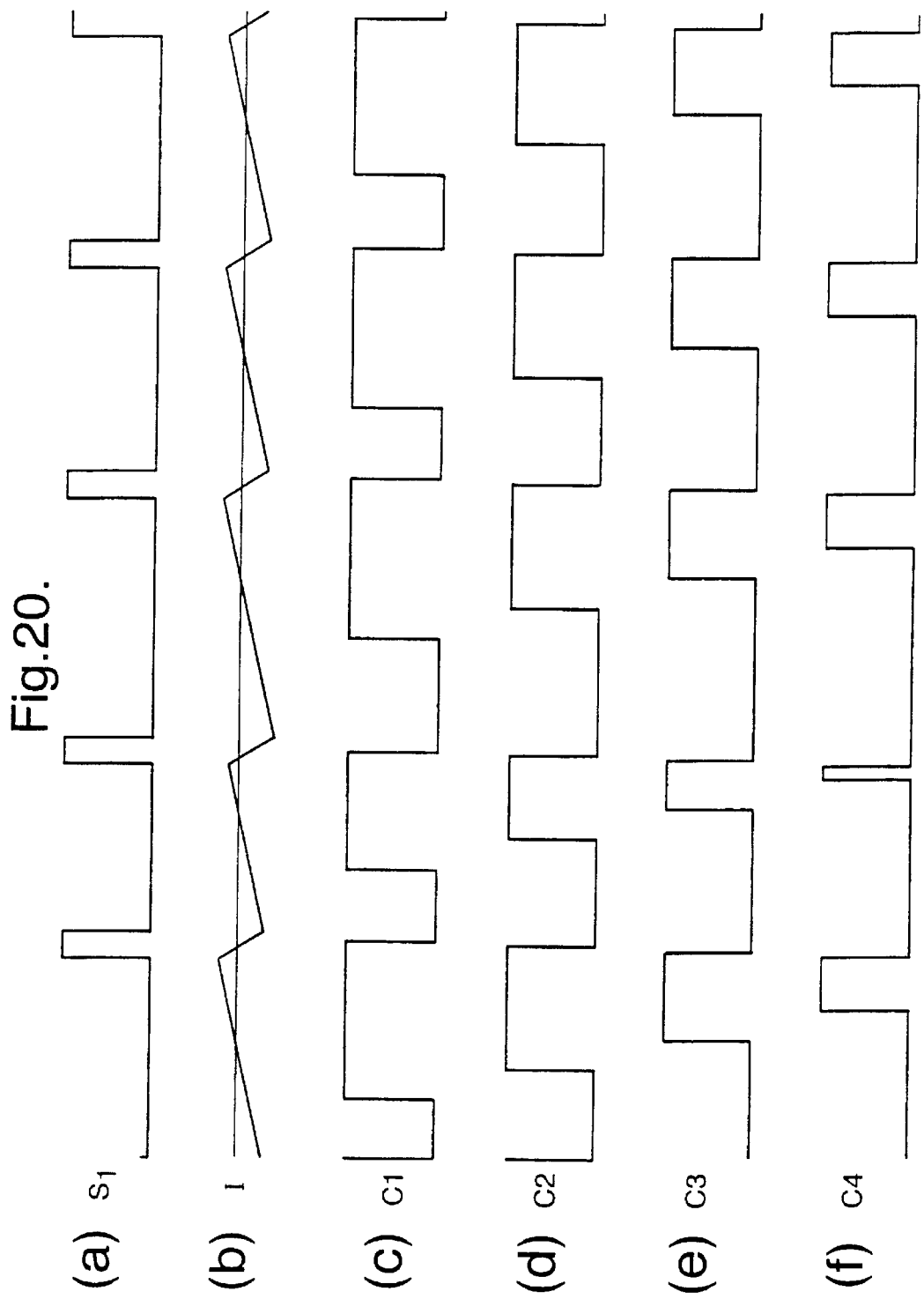
FIGS. 20(a) to 20(f) show voltage waveforms observed at different points in the circuit of FIG. 19.

Another way of achieving similar length clock pulses in a multiphase clock generator based on an anti-jitter circuit over a narrow range of input frequencies is shown in FIG. 19. Components 361,362,363,364,365,366 and 367 comprise an anti-jitter circuit incorporating a speed-up circuit comprising Zener diodes 368 and 369. The circuit also includes a monostable 370 and a multiplicity of comparator/monostable pairs. In this embodiment, there are three such pairs referenced, 371,372; 373,374; 375,376. FIGS. 20a to 20f show voltage waveforms observed at different points in the circuit of FIG. 19. Circuits similar to the circuits shown in FIGS. 16,18 and 19 could be provided with pulse insertion circuitry of the kind described with reference to FIGS. 1 to 7 and/or pulse deletion circuitry of the kind described with reference to FIGS. 8 to 15 and such circuits would be useful for the restoration of clock signals.

Anti-jitter circuits described in accordance with this aspect of the invention may be fitted with a multiphase output arrangement of the kind described in a paper by T. V. Rama Murthy—"Continuous phase shifter for square waves", Electronic Engineering, Mid-April 1979, p19, providing an arbitrary phase relationship with the input. The arrangement described in this paper refers to square waves, but the arrangement could clearly be adapted to output waves of arbitrary mark-space ratio and phase relation by providing the thresholds to the comparators in a more general way.

Another aspect of the invention relates to low noise fractional rate multiplier circuits, particularly, though not exclusively, low noise fractional rate multiplier circuits which are useful in fractional-N phase-locked loop synthesisers.

It is often a requirement in electronics to create a new periodic electrical signal source with a frequency which is a multiple or fraction of a constant reference periodic signal source. The new signal will have jitter; that is, its signal edges will vary relative to signal edges in a precisely periodic signal of the same frequency. It is an object of this aspect of the invention to reduce that jitter. In the description which follows phase noise will be referred to as jitter. Phase noise is proportional to jitter, and so reduction of one is equivalent to reduction of the other.

Figure 2:
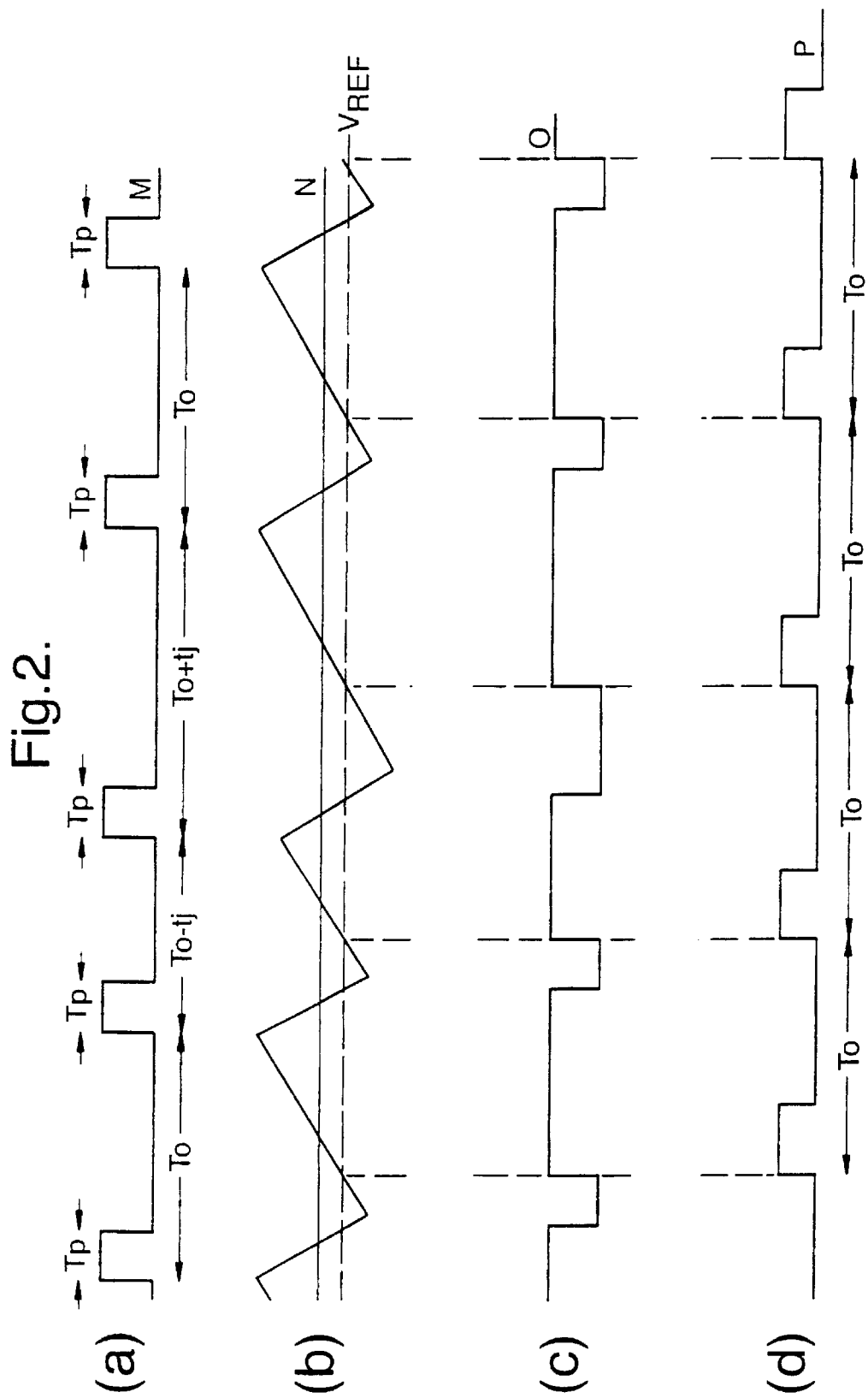
FIGS. 2(a) to 2(d) show different waveforms useful in understanding operation of the phase noise reduction circuit of FIG. 1.

In the embodiments which follow the anti-jitter circuits (AJC) used are of the kind described in WO97/30516, such as the circuits described with reference to FIGS. 1 to 3 of the accompanying drawings.

Instead of using a single AJC it would alternatively be possible to use a series cascade of two or more AJCs interconnected so that the output of one AJC becomes the input to another AJC. The jitter reduction produced by the first AJC is multiplied by the next AJC, and so on. For example, if a single AJC has a jitter reduction of 20 dB, then ideally a cascade of two such AJC circuits will have a jitter reduction of 40 dB and ideally a cascade of three AJCs will have a jitter reduction of 60 dB. In practice, this process is limited by the noise performance of the AJC components so that jitter reduction will be markedly reduced for each circuit in excess of two. Therefore, it is rarely worthwhile employing more than three AJC circuits in cascade.

In relatively simple applications a high speed reference source is used as the source from which a desired lower frequency is obtained.

The simplest way of using an AJC in frequency synthesis is to add one to a module-N divider applied to a high frequency source. Module-N dividers reduce jitter relative to the period of the output waveform, by exactly their modulus of division N. However, the residual jitter can be reduced still further by the use of an AJC. If an AJC is obtainable at a high enough frequency of operation, the AJC is applied directly to the HF reference. Otherwise the AJC is applied after an initial division stage Ni, with further division by No after the AJC, where Ni•No=N.

The AJC circuit can have a bigger impact if it is used directly with some types of rate multiplier circuits. The function of a fractional rate multiplier circuit is to output A pulses for every B input pulses, where A can vary, for instance, from 1 to 1000 while B stays constant at 1000. Thus the input frequency is multiplied by A/B. A fractional rate multiplier can be of several possible designs, which vary in how much intrinsic jitter their outputs possess.

A particularly convenient form of rate multiplier is the type which successively adds a constant number, the phase increment to an accumulator, giving an output every time the accumulator overflows (successive addition rate multiplier or SARM). This has the advantage that it works by skipping pulses in the input pulse train in such a way that its maximum output jitter is less than a complete period of the output waveform. This sort of waveform is correctly dejittered by the AJC, so that a SARM can be straightforwardly enhanced by the addition of an AJC. (Note that a direct digital frequency synthesiser (DDS) with a 1-bit output is equivalent to a SARM). FIG. 25 shows how a single AJC circuit, or better still, two AJC circuits in series, can reduce the spurious 500 kHz components in a 10 MHz signal.

A simple rate multiplier, such as the BCD rate multiplier Type HEF4527 (See "HE4000B Logic Family CMOS Handbook", Philips Semiconductor PO Box 218, 5600 MD Eindhoven) has a high intrinsic output jitter in multiplying by 7/10. For example, the HEF4527 gives a set of 4 pulses at unit spacing, then a missing pulse gap, then 3 pulses at unit spacing, then a double missing pulse gap, i.e. a maximum output jitter of more than a complete output period. Such a waveform (and similar waveforms from cascaded HEF4527 circuits) has too much jitter to be successfully dejittered by an AJC directly. Instead, the fractional rate multiplier must be followed by a divider, before the AJC can be applied. With a typical BCD multiplier the required divider can have any integer modulus of division from 2 upwards. If the divided-by-2 output frequency is unacceptable, then the output can be multiplied by 2 using a range of known multiplier circuits, for instance a x2 harmonic multiplier.

To provide a large number of possible division ratios efficiently, more sophisticated schemes using dividers and AJCs are useful; for example, those which involve pulse subtraction.

Figure 21:
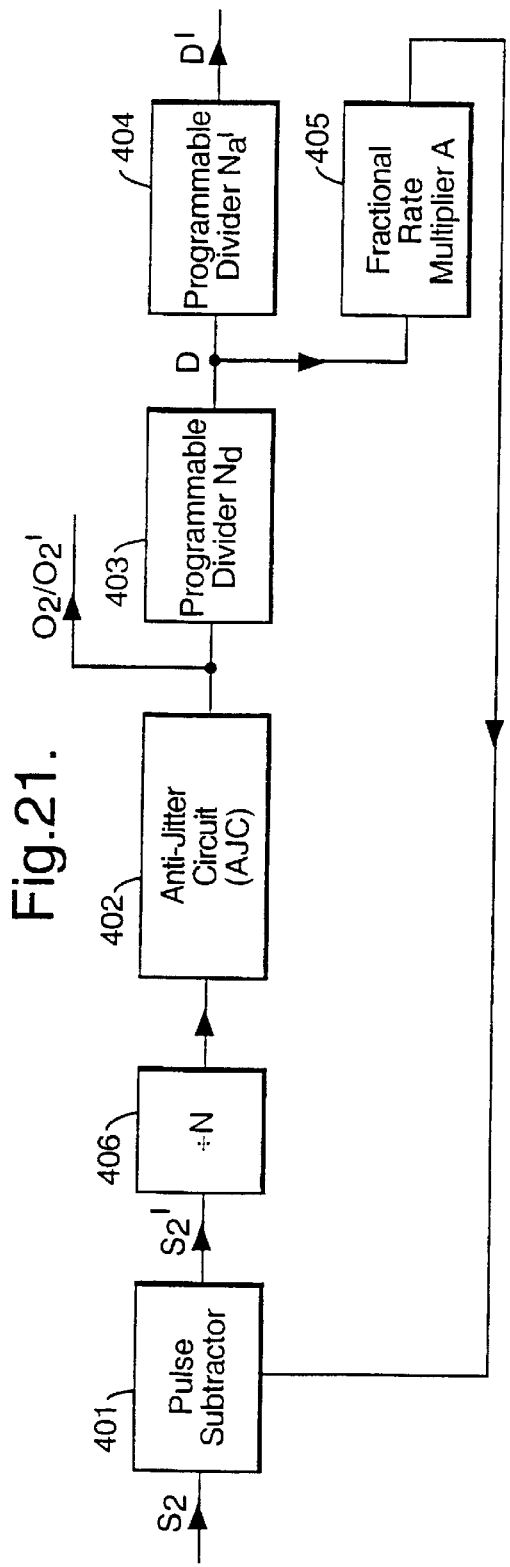
FIG. 21 shows a fractional rate multiplier circuit according to the invention.

Referring to FIG. 21, a pulse subtracter 401 removes isolated pulses from the input pulse train $S_2$ to produce a modified pulse train $S_2'$. Then anti-jitter circuit 402 (AJC) reduces jitter on the signal to produce pulse trains $O_2$ or $O_2'$. If the AJC 402 has no output monostable, then the waveform $O_2$ is seen, where only one of the pulse edges has reduced jitter. With an output monostable, then the waveform $O_2'$ is seen, where both edges of the output pulse train have low jitter. A programmable divider 403 then divides the frequency by an integer factor Na, then a programmable divider 404 divides the frequency by a further factor of Na'. A fractional rate multiplier 405 outputs Aa pulses for every M input pulses it receives. The circuit of FIG. 21 provides a versatile way of generating a very large number of possible output frequencies all related precisely to the input frequency. After a time constant related to the frequency of operation and the time constants inside the AJC 402, the output signal will be phase-locked to the input signal. An optional divide-by-N circuit 406 is shown which would allow the AJC 402 to deal with missing pulses more easily. For best overall jitter reduction N should be small but not unity. Depending upon the application, any of waveforms $O_2, O_2', D, D'$ may be used as outputs.

FIGS. 22a to 22e show typical waveforms observed at different points in the circuit of FIG. 21 in which the AJC is used to suppress jitter in the output of a rate multiplier. The box in FIGS. 22 shows a complete cycle during which the rate multiplier subtracts 1 out of every 5 of the input pulses $S_2$ producing jittered waveform $S_2'$. The waveform of the integrator inside the AJC 402 is shown as trace I (FIG. 22c).

In order to illustrate the operation of the circuit, an example will be considered. It will be assumed that the input pulse train $S_2$ has an input frequency of 100 MHz, that Na is set to 100, that Aa is set at 100 and that Na' is set at 1 (equivalent to omitting the divider 404 and replacing it with a straight through connection). The output pulse train $O_2/O_2'$ has a basic frequency of f/100=1000 kHz before pulse subtraction. The fractional rate multiplier then outputs 50 pulses out of every 100 input to it, i.e. a subtraction of input pulses at the rate of 500 kHz. These subtracted pulses reduce the input to the AJC 402 to 99.50 MHz. This will not change the output of the fractional rate multiplier much, and so the output frequency of $O_2$ is almost exactly 99.5 MHz, and the divided output frequency of waveform D is 99.5/Na', i.e. 995 kHz. In fact, the exact formula for the output frequency, taking account of the reduced number of pulses input to the rate multiplier, is $$Fo=Fi/(Na+Aa),$$

where Fi and Fo are the input and output frequencies respectively. This gives a divided output frequency of 995.025 kHz for the example quoted above.

Clearly, in this example, the setting of Na and Aa allows 10,000 discrete frequencies to be chosen. These are the possibilities using a circuit according to FIG. 21 in which the input frequency is 100 MHz. Aa is variable from 0.01 to 0.99 in units of 0.01 and Na is variable from 201 to 1. The selectable frequencies are evenly spread throughout the spectrum, with spacing as a percentage of output frequency increasing from 0.005% at 500 kHz output to 1% at worst case (near 100 MHz).

These settings can be combined with the setting of the divider 403 to values of (say) between 1 and 1000 to give an almost continuous range of output frequencies $O_2/O_2'$ from 100 MHz down to 100 kHz so that in this example, frequencies of between 100 kHz and 100 MHz in steps of from 0.1 Hz to 100 Hz are available. The use of a downstream divider 404 allows still lower ranges of frequency to be accessed.

Figure 23:
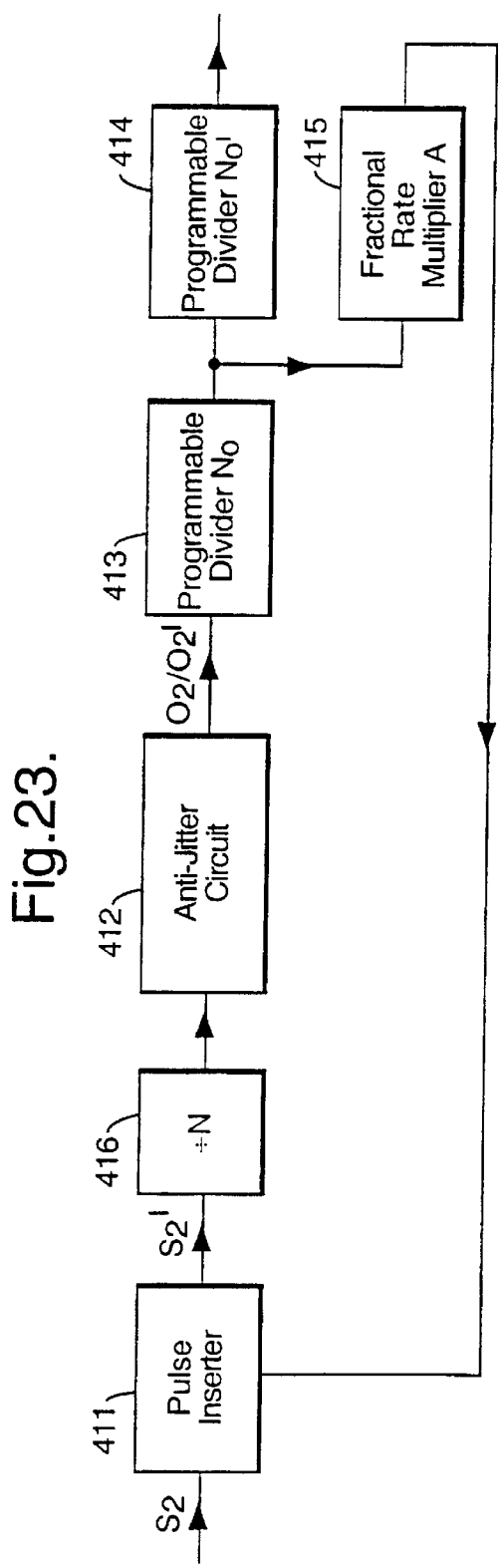
FIG. 23 shows an alternative fractional rate multiplier circuit according to the invention.

An alternative embodiment of the invention shown in FIG. 23 employs a pulse inserter 411 in place of the pulse subtracter 401. In other respects, the circuit functions in a very similar manner to that described with reference to FIG. 21.

Where an output frequency is required which exceeds, perhaps greatly, the available reference frequency, use can be made of the phase locked loop (PLL) concept, as described for example in "Radio Receivers" by W Gosling (Ed), Peter Peregrinus Ltd 1996, Chapter 4 "Frequency Synthesisers and Standards" M Underhill, ISBN-0-86341056. Using this concept a voltage controlled oscillator providing the output is phase locked to an exact (possibly fractional) multiple of the reference frequency. The use of an AJC circuit in the PLL allows fractional-N synthesis without the usual poor jitter performance.

Figure 24:
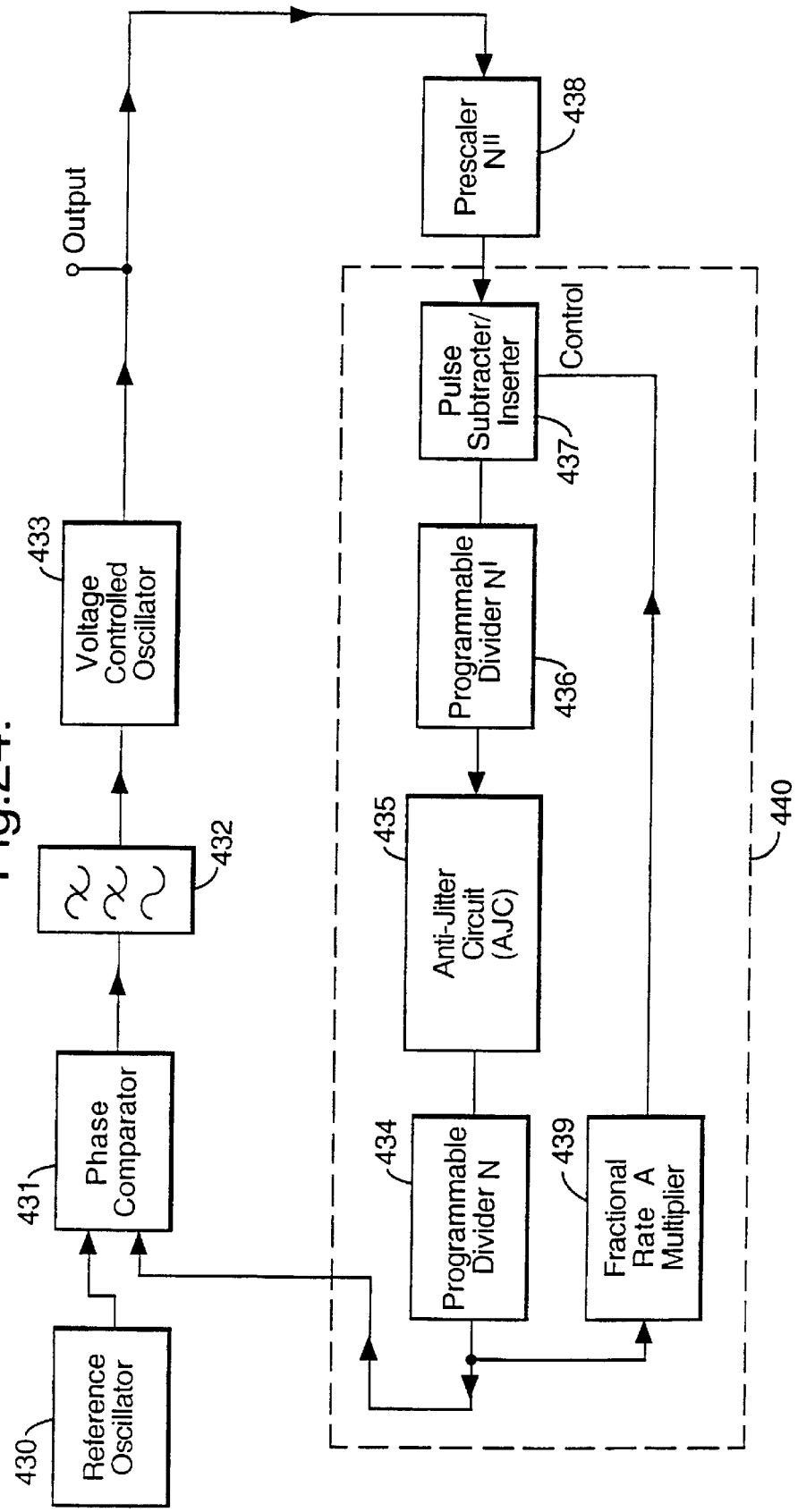
FIG. 24 shows a fractional-N frequency synthesiser including the fractional rate multiplier circuit of FIG. 21 or FIG. 23.

Referring to FIG. 24, a fractional-N frequency synthesiser circuit is shown which incorporates as a subsystem a low noise fractional rate multiplier 440 of the kind exemplified by the circuits of FIGS. 21 and 23. The circuit phase locks the voltage controlled oscillator (VCO) 433 to a harmonic or subharmonic of the reference oscillator 430. It is capable of locking VCO 433 to a very large number of possible discrete frequencies, governed by the settings N,N' and N" of the dividers 434,436 and the prescaler 438 respectively.

The choice of N,N' and N" is determined as follows:

N" is ideally 1 (i.e. no prescaler), but with very high frequency VCOs, it may not be possible to run a programmable divider at the full VCO frequency. (Many programmable dividers run 3 times or more slower than a simple prescaler flip-flop based circuit). In such cases, the use of a small factor N", perhaps 2 or 4 or 8, should usually be sufficient. This approach may also be used to minimise power consumption of the overall synthesiser system, as the fast logic used for prescalers is a heavy user of power.

N' is also ideally 1 (i.e. no divider before the AJC 435). However, the AJC 435 is complex and will not in general be able to run as fast as a high frequency VCO. Also, the AJC may offer better jitter reduction at lower pulse frequencies. N' is chosen to maximise the frequency at which the AJC can operate without degrading its jitter reduction too much. N is chosen to provide the nearest module-N division which gives an output frequency just larger than the reference frequency. This will allow a minimum of pulses to be subtracted by the fractional rate multiplier and minimise the generation of jitter.

The programmable dividers may advantageously be of the multiple feedback type exemplified by the Philips HEF4751 and SAA1057 frequency synthesiser integrated circuits.

The fractional rate multiplier factor A is chosen to subtract pulses (reducing the comparison frequency presented to the phase comparator) at a frequency which will allow the VCO to tune up and then lock to the required output frequency.

For example with a reference oscillator of 100 kHz and a VCO capable of producing 100 MHz to 1 GHz, the dividers N,N' and N" need to be set to achieve a division ratio of between 1000 and 10,000. Suppose that N" is 1, that N'=10 and N=500. In this way, the circuit phase comparator will pass a voltage to the VCO which will move it up to 500 MHz. Suppose the fractional rate multiplier is set to subtract every $1000^{th}$ pulse (a rate multiplication A of 0.999). In this way every 1000 pulses, i.e. every 10 milliseconds, a pulse is removed from the oscillator output. This reduces the frequency of the input to the dividers by one pulse every 10 milliseconds, i.e. from 500.000000 MHz to 499.999900 MHz. This lower frequency input will be seen at the phase comparator which then passes on an increased voltage to the VCO, which will increase its frequency from 500.000000 MHz to 500.000010 MHz after a few system time constants have elapsed. It is easy to show that by suitable choice of N (and N',N") and A, the VCO can be locked onto any one of nine million frequencies from 100 MHz to 1 GHz.

A fractional-N synthesiser with an AJC constructed according to this aspect of the invention has demonstrated the performance improvement attainable. In this example a Motorola integrated circuit type MC12022A 64/65 prescaler was employed to provide pulse subtraction. 2 BVD rate multipliers, circuit type CD4522B were cascaded to provide steps of $1/100^{th}$ of the 6.991 kHz reference frequency. The programmable divider was a Motorola circuit type MC14060B and the phase comparator was a Motorola circuit type MC14046B. A loop filter was designed according to the information in the makers' data sheet but with the size of the integrator capacitor increased to keep the proportional loop gain the same. As a result, the loop filter will behave as if it is a type 1 system loop filter after initial phase lock has been achieved. The VCO used was the Motorola circuit type MC1648 with an output frequency of 115 MHz.

FIG. 26 shows the effect of suppression of jitter by an AJC of (a)6.991 kHz and (b)139.82 Hz components in the output of a fractional-N frequency synthesiser according to the invention. The reference and its harmonic spurious signals are significantly suppressed by the AJC in the divider chain. The reduction by 19 dB in the 6.991 kHz spaced components was unexpectedly large. The reduction by 10 dB in the 139.82 Hz spaced components could have been improved by the use of a sample/hold or high gain phase comparator rather than the pulse width type actually employed for this demonstration (the poor phase comparator performance is masking the improvement in jitter being achieved by the AJC).

In general, the pulse subtractors and the pulse inserters used in the circuits of FIGS. 21,23 and 24 will add to the intrinsic jitter in the input pulse train. Similarly, a fractional rate multiplier in effect deletes pulses input thereto, and this also creates jitter. However, the AJC circuit used in these circuits is capable of reducing this additional source of jitter (as well as the intrinsic jitter), typically by a factor of 20 dB or more. Jitter is further reduced in the system by a factor of N, i.e. the programmable divider ratio.

The described pulse subtractor may be replaced by a circuit including a variable modulus divider and a counter. By way of example, a divider whose nominal division ratio is 10 can be switched to divide by a factor of 11 for a given set of 110 consecutive input pulses in response to a control signal, i.e. after 110 pulses 10 rather than 11 pulses will have been output. An even simpler circuit can be switched to divide by either 1 or 2. Each time the circuit is commanded to divide by 2 it effectively removes one of the input pulses.

Similarly, the described pulse inserter may also be replaced by a circuit including a variable modulus divider and a counter; for example, a divider having a nominal division rate of 10 can be switched to divide by 9 for a given set of 90 consecutive input pulses, i.e. after 90 pulses 10 rather than 9 pulses will have been output.

In all the circuits herein described, variations will be apparent to those skilled in the art of electronic circuits which do not vary materially from the invention. For example, sets of logic gates may be replaced with alternative sets which have the same mathematical function (Boolean logic function).

As already explained, circuits according to the invention find application, inter alia, in the restoration of clock signals and other regular pulse trains from communications circuits subject to noise, interference, crosstalk or other problems which cause jitter to occur.

What is claimed is:

1. A clock restoration circuit for reducing noise in an input pulse train consisting of pulses having a nominal periodicity and from which one or more pulses is missing, the clock restoration circuit including, DC removal means for removing a DC level from the input pulse train, integrator means for integrating the input pulse train after said DC level has been removed therefrom by the DC removal means, detection means for receiving an output from the integrator means and for detecting from said output a missing pulse in the input pulse train, pulse generating means responsive to the detection means for inserting into the input pulse train an additional pulse delayed with respect to said missing pulse detected by the detection means and output means for generating an output pulse train from said output from the integrator means.

2. A circuit as claimed in claim 1, wherein said output means is effective to reduce phase noise caused by a delay of said additional pulse.

3. A circuit as claimed in claim 2, wherein said output means comprises a comparator for comparing the output from the integrator means with a reference level and for generating a comparison signal as a result of the comparison and an output monostable circuit for deriving the output pulse train from the comparison signal.

4. A circuit as claimed in claim 1 including input means for deriving said input pulse train from a waveform received from an external source.

5. A circuit as claimed in claim 4, wherein said input means is an input monostable circuit.

6. A circuit as claimed in claim 1, comprising frequency-doubling means for deriving said input pulse train from a waveform received from an external source and wherein said output means includes a divide-by-two circuit.

7. A circuit as claimed in claim 1 wherein said detection means comprises a comparator for comparing the output from said integrator means with a threshold value which is preset so as to exceed the highest attainable value of the output from the integrator means when no pulse is missing, and said pulse generating means is arranged to insert said additional pulse into the input pulse train when said comparator detects that the output from the integrator means has crossed said threshold value.

8. A circuit as claimed in claim 7, wherein said pulse generating means comprises a monostable circuit triggered by a detection signal output by said comparator when the value of the output from the integrator means has crossed said threshold value.

9. A circuit as claimed in claim 8, wherein said input pulse train is supplied to the integrator means via an OR gate, said monostable circuit of the pulse generating means being connected to a first input of the OR gate and said input pulse train being supplied to a second input of the OR gate.

10. A circuit as claimed in claim 1 including control means responsive to an output from said detection means for disabling the DC removal means upon detection by the detection means of said missing pulse and for re-enabling the DC removal means upon detection by the detection means of the next pulse in the input pulse train.

11. A circuit as claimed in claim 1 including circuit means for reducing phase jitter in said output pulse train.

12. A circuit as claimed in claim 11 wherein said circuit means comprises further DC removal means for removing a DC level from the output pulse train, further integrator means for integrating the output pulse train after said DC level has been removed therefrom to produce an integrated output and processning means for deriving from the integrated output said output pulse train having reduced phase jitter.

13. A circuit as claimed in claim 12 wherein said processing means comprises a comparison circuit for comparing the integrated output from the further integrator means with a reference level and for generating a comparison signal as a result of the comparison, and an output circuit for extracting from the comparison signal said output pulse train having reduced phase jitter.

14. A circuit as claimed in claim 13, wherein said output circuit is a monostable circuit.

15. A circuit as claimed in claim 6, wherein said frequency doubling means comprises means for deriving a first pulse train from a received waveform, said first pulse train consisting of pulses triggered by positive-going transitions, means for deriving a second pulse train from the received waveform, said second pulse train consisting of pulses triggered by negative-going transitions and means for combining the first and second pulse trains to form said input pulse train.

16. A circuit as claimed in claim 1 including a monostable circuit for causing pulses of the input pulse train to have the same pulse width.

17. A phase noise reduction circuit for reducing phase noise in an input pulse train consisting of pulses having a nominal frequency f, the phase noise reduction circuit comprising, means for deriving a first pulse train from the input pulse train, the first pulse train consisting of pulses triggered by positive-going transitions of the pulses forming the input pulse train, means for deriving a second pulse train from the input pulse train, the second pulse train consisting of pulses triggered by negative-going transitions of the pulses forming the input pulse train, combining means for combining the first and second pulse trains to form a combined pulse train, DC removal means for removing a DC level from the combined pulse train, integrator means for integrating the combined pulse train after said DC level has been removed from the combined pulse train by the DC removal means to produce an integrated output and processing means for deriving from the integrated output an output pulse train at said nominal frequency f.

18. A circuit as claimed in claim 17 wherein said processing means comprises a comparator for comparing the integrated output with a reference level and for generating a comparison signal as a result of the comparison, and an output circuit for extracting said output pulse train from the comparison signal.

19. A circuit as claimed in claim 18 wherein said output circuit is a divide-by-two circuit.

20. A clock restoration circuit for reducing noise in an input pulse train consisting of pulses which have a nominal periodicity and amongst which one or more spurious additional pulse is present, the clock restoration circuit including, DC removal means for removing a DC level from the input pulse train, integrator means for integrating the input pulse train after said DC level has been removed from the input pulse train by the DC removal means, pulse deletion means for deleting a said spurious additional pulse from the input pulse train, said pulse deletion means comprising pulse generating means for receiving an output from said integrator means and for generating blanking pulses in response to said output and means for combining said blanking pulses with said pulses of said input pulse train to delete said one or more spurious additional pulse and output means for deriving an output pulse train from said output from the integrator means.

21. A circuit as claimed in claim 20 wherein the pulse generating means generates a blanking pulse after each said periodic pulse.

22. A circuit as claimed in claim 20 including means for detecting for a missing pulse in the input pulse train and means for inserting a pulse in the input pulse train in response to detection of a missing pulse.

23. A circuit as claimed in claim 20 including input means for deriving the input pulse train from a waveform received from an external source.

24. A circuit as claimed in claim 23 wherein the input means is an input monostable circuit.

25. A circuit as claimed in claim 20 including frequency doubling means for deriving said input pulse train from a received waveform and wherein said output means includes a divide-by-two circuit.

26. A circuit comprising two circuits each as claimed in claim 20 wherein one of said two circuits acts on an input waveform, another of said two circuits acts on the inverse of the input waveform, and each of whose outputs are fed to a divide-by-two circuit, the outputs of the divide-by-two circuits being combined in an OR gate to form a single common output.

27. A circuit comprising two circuits each as claimed in claim 20 wherein one of said two circuits acts on an input waveform, another of said two circuits acts on the inverse of the input waveform, and each of whose outputs are fed to the set and reset inputs of a flip-flop, the output of which forms a single common output.

28. A circuit as claimed in claim 25 wherein said frequency doubling means comprises means for deriving a first pulse train from a received waveform, the first pulse train being triggered by positive-going transitions, means for deriving a second pulse train from said received waveform, the second pulse train being triggered by negative-going transitions, and means for combining the first and second pulse trains to form the input pulse train.

29. A circuit as claimed in claim 20 wherein said output means comprises a monostable circuit.

30. A circuit as claimed in claim 20 wherein said output means includes means for reducing time jitter in the output pulse train.

31. A circuit as claimed in claim 20 wherein said means for combining comprises a latch circuit having a terminate input for receiving said blanking pulses.

32. A circuit as claimed in claim 20 including a monostable circuit for causing pulses of the input pulse train to have the same pulse width.

33. A circuit for reducing phase noise in an input pulse train consisting of pulses having a nominal periodicity, the circuit including DC removal means for removing a DC level from the input pulse train, integrator means for integrating the input pulse train after said DC level has been removed from said input pulse train by the DC removal means and at least two detection means for producing different output pulse trains in response to an output from the integrator means and to respectively different reference signals whereby each said output pulse train contains periodic transitions having a respective phase relationship to transitions of the input pulse train dependent on the corresponding said reference signal.

34. A circuit as claimed in claim 33 including a plurality of said detection means and output means for deriving one or more substantially jitter-free output pulse trains from said output pulse trains respectively produced by one or more pairs of said detection means.

35. A circuit as claimed in claim 34 wherein said output means includes a latch circuit and toggling means for toggling the latch circuit between its output logic states in response to the output pulse trains produced by a said pair of detection means whereby to generate a corresponding said substantially jitter-free output pulse train.

36. A circuit as claimed in claim 35 wherein aid toggling means comprises a pair of monostable circuits each connected to receive the output pulse train produced by a different detection means of said pair of detection means.

37. A circuit as claimed in claim 33 including means for deleting a spurious additional pulse in the input pulse train.

38. A circuit as claimed in claim 33 including means for inserting a pulse into the input pulse train upon detection of a missing pulse in the input pulse train.

39. A circuit as claimed in claim 33 including a monostable circuit for causing pulses in the input pulse train to have the same pulse width.

\* \* \* \* \*